US012713545B2

(12) United States Patent
Zhang et al.

(10) Patent No.: US 12,713,545 B2
(45) Date of Patent: Aug. 18, 2026

(54) FOLDING ASSEMBLY, FOLDING APPARATUS, AND TERMINAL DEVICE

(71) Applicant: HONOR DEVICE CO., LTD., Shenzhen (CN)

(72) Inventors: Yaolei Zhang, Shenzhen (CN); Dengpan Yu, Shenzhen (CN); Bin Yan, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 96 days.

(21) Appl. No.: 18/837,825

(22) PCT Filed: Aug. 11, 2023

(86) PCT No.: PCT/CN2023/112644
§ 371 (c)(1),
(2) Date: Aug. 12, 2024

(87) PCT Pub. No.: WO2024/046096
PCT Pub. Date: Mar. 7, 2024

(65) Prior Publication Data

US 2025/0159819 A1 May 15, 2025

(30) Foreign Application Priority Data

Sep. 2, 2022 (CN) ......................... 202211072274.2

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01); *G06F 1/1681* (2013.01)

(58) Field of Classification Search
CPC ...... H05K 5/0217; H05K 5/0226; G06F 1/16; G06F 1/1652; G06F 1/1681
See application file for complete search history.

(56) References Cited

U.S. PATENT DOCUMENTS

| | | | | |
|---|---|---|---|---|
| 10,901,464 | B2 * | 1/2021 | Seo | G06F 1/1652 |
| 11,615,722 | B2 * | 3/2023 | Morino | G06F 1/1616 345/173 |

(Continued)

FOREIGN PATENT DOCUMENTS

| | | | |
|---|---|---|---|
| CN | 113194183 | A | 7/2021 |
| CN | 214756425 | U | 11/2021 |

(Continued)

*Primary Examiner* — Sagar Shrestha
(74) *Attorney, Agent, or Firm* — WOMBLE BOND DICKINSON (US) LLP

(57) ABSTRACT

This application provides a folding assembly, a folding apparatus, and a terminal device. The folding assembly includes a base, a support member, and at least two swing arms. Each swing arm is provided with a first push part and a second push part. The first push part and the second push part are arranged in sequence in a direction of a rotation axis of the swing arm. During rotation of the swing arm from the unfolded position to the folded position, the first push part is driven to rotate to push the support member to move toward the base. During rotation of the swing arm from the folded position to the unfolded position, the second push part is driven to rotate to push the support member to move away from the base.

20 Claims, 18 Drawing Sheets

(56) References Cited

U.S. PATENT DOCUMENTS

| | | | | |
|---|---|---|---|---|
| 2015/0233162 | A1* | 8/2015 | Lee | H04M 1/022 16/223 |
| 2018/0146560 | A1* | 5/2018 | Chen | G02F 1/133308 |
| 2022/0182471 | A1* | 6/2022 | Cha | H04M 1/0268 |
| 2022/0247846 | A1 | 8/2022 | Lim | |
| 2023/0032983 | A1 | 2/2023 | Feng | |
| 2023/0151656 | A1* | 5/2023 | Yang | E05D 3/18 360/266.6 |
| 2023/0297144 | A1* | 9/2023 | Kinoshita | H04M 1/0266 361/679.01 |
| 2024/0094785 | A1 | 3/2024 | Cheng et al. | |
| 2024/0218902 | A1 | 7/2024 | Feng et al. | |
| 2024/0219973 | A1 | 7/2024 | Zhang et al. | |
| 2024/0259487 | A1* | 8/2024 | Sun | G06F 1/1616 |
| 2024/0302868 | A1* | 9/2024 | Feng | G06F 1/1681 |
| 2024/0357025 | A1 | 10/2024 | Zhang et al. | |
| 2024/0410418 | A1* | 12/2024 | Lin | F16C 11/04 |

FOREIGN PATENT DOCUMENTS

| | | | |
|---|---|---|---|
| CN | 113905113 | A | 1/2022 |
| CN | 113923281 | A | 1/2022 |
| CN | 114095592 | A | 2/2022 |
| CN | 114430432 | A | 5/2022 |
| CN | 114446164 | A | 5/2022 |
| CN | 114466092 | A | 5/2022 |
| JP | 2005318249 | A | 11/2005 |
| WO | 2021213509 | A1 | 10/2021 |

* cited by examiner

FOLDING ASSEMBLY, FOLDING APPARATUS, AND TERMINAL DEVICE

CROSS-REFERECNE TO RELATED APPLICATIONS

This application is a national stage of International Application No. PCT/CN2023/112644, filed on Aug. 11, 2023, which claims priority to Chinese Patent Application No. 202211072274.2, filed on Sep. 2, 2022. The disclosures of both of the aforementioned applications are hereby incorporated by reference in their entireties.

TECHNICAL FIELD

This application relates to the field of foldable electronic device technologies, and in particular, to a folding assembly, a folding apparatus, and a terminal device.

BACKGROUND

A foldable electronic device refers to an electronic device that can be folded and unfolded, such as a foldable-screen mobile phone, a foldable-screen tablet computer, and a foldable-screen notebook personal computer. The foldable electronic device generally includes a folding apparatus and a foldable screen disposed on the folding apparatus. The folding apparatus can be folded or unfolded through a folding mechanism of the folding apparatus, and the foldable screen can be folded or unfolded together with the folding apparatus. In an example in which the foldable screen is an inward-foldable screen, when the foldable screen is in a folded state, a bending part of the foldable screen protrudes outward and moves downward a specific distance relative to plate surfaces at two sides of the folding apparatus that support the foldable screen, and is therefore prone to interference with another component. For this reason, a solution in which a folding mechanism is configured to include a vertically adjustable lifting/lowering plate is provided in the related art. When a foldable screen is in a folded state, the lifting/lowering plate is lowered to avoid a bending part of the foldable screen. When the foldable screen is in an unfolded state, the lifting/lowering plate is lifted to support the foldable screen.

However, components such as a spring providing elastic force for lifting and lowering the lifting/lowering plate as well as a sliding column and a fixed base for placement of the spring need to be provided in the folding mechanism in the related art to implement the lifting and lowering of the lifting/lowering plate. Consequently, the folding mechanism occupies large space of the folding apparatus in a thickness direction. This hinders the design of a lightweight and thin foldable device.

SUMMARY

Embodiments of this application provide a folding assembly, a folding apparatus, and a terminal device, to solve the technical problem in the related art that a folding mechanism occupies large space of the folding apparatus in a thickness direction.

To achieve the foregoing objective, the following technical solutions are used in embodiments of this application.

According to a first aspect, an embodiment of this application provides a folding assembly. The folding assembly includes:

a base;

a support member; and at least two swing arms, respectively arranged at two sides of the support member, where the swing arms are rotatably connected to the base to enable each swing arm to be rotatable between an unfolded position and a folded position;

each swing arm is provided with a first push part and a second push part, and the first push part and the second push part are arranged in sequence in a direction of a rotation axis of the swing arm: the support member includes first surfaces and second surfaces, each first surface is arranged corresponding to the first push part, and each second surface is arranged corresponding to the second push part; and during rotation of the swing arm from the unfolded position to the folded position, the first push part abuts against the first surface to push the support member to move toward the base, and during rotation of the swing arm from the folded position to the unfolded position, the second push part abuts against the second surface to push the support member to move away from the base.

The foregoing technical solution in embodiments of this application at least has the following technical effects or advantages.

In the folding assembly provided in embodiments of this application, the swing arm is provided with the first push part and the second push part. During rotation of the swing arm from the unfolded position to the folded position, the swing arm drives the first push part to rotate together, so that the first push part can abut against the first surface to push the support member to move toward the base. During rotation of the swing arm from the folded position to the unfolded position, the swing arm drives the second push part to rotate together, so that the second push part can abut against the second surface to push the support member to move away from the base. In this way, the support member can be controlled to move toward or away from the base through the rotation of the swing arm, the first push part, and the second push part, so as to control lowering and lifting of the support member. In this process, the first push part and the second push part can positionally limit the support member, and there is no need to provide additional springs or other components to provide force for the lifting and lowering of the support member, so that a structure can be simplified, and the required space in a thickness direction of the folding apparatus using the folding assembly is reduced. In addition, because the first push part and the second push part are arranged in sequence in a direction of a rotation axis of the swing arm, the first push part and the second push part may be relatively staggered in the direction of the rotation axis of the swing arm. Compared with a situation in which the first push part and the second push part are in a same position in the direction of the rotation axis of the swing arm, which results in a superposition in the thickness dimension of the first push part, the second push part, and space or an entity between the first push part and the second push part, the support member can be provided with an upward push and a downward push respectively at different positions in the direction of the rotation axis of the swing arm. In other words, in a same position in the direction of the rotation axis of the swing arm, the first push part and the second push part can be fitted with only one surface of the support member. In this way, part of the burden of the thickness is transferred into the direction of the rotation axis of the swing arm, so as to reduce the overall superposed dimension, in the thickness direction, of the first push part, the second push part, and the space or entity between the first push part and the second push part, thereby reducing the thickness dimension of the folding assembly and reducing the space of the folding apparatus occupied in a thickness direction by the folding assembly.

In an embodiment of the first aspect, the support member includes the first surface and the second surface on each of the two sides thereof, the first surface is configured to contact and be fitted with the first push part on a same side, and the second surface is configured to contact and be fitted with the second push part on a same side; and when the swing arm is in a position between the unfolded position and the folded position, the first push part is located on a side of the first surface away from the base, and the second push part is located on a side of the second surface close to the base.

In an embodiment of the first aspect, in a thickness direction of the support member, a height of the first surface is lower than or equal to a height of the second surface; and the thickness direction of the support member is parallel to a direction in which the support member moves toward or away from the base.

In an embodiment of the first aspect, the support member includes:

- a main body part;
- first protruding parts, where each of two sides of the main body part is provided with the first protruding part; and
- second protruding parts, where each of the two sides of the main body part is provided with the second protruding part; and
- the first protruding part includes the first surface on a side thereof away from the base, and the second protruding part includes the second surface on a side thereof close to the base.

In an embodiment of the first aspect, the swing arm is provided with a first recess and a second recess; when the swing arm is in the unfolded position, the first protruding part at least partially projects into the first recess; and when the swing arm is in the folded position, the second protruding part at least partially projects into the second recess; and

- the first push part is provided on an inner wall and/or an outer edge of the first recess, and the second push part is provided on an inner wall and/or an outer edge of the second recess.

In an embodiment of the first aspect, relief spaces are provided in the base, and positions of the relief spaces correspond to positions of the first protruding parts; and when the swing arm is in the folded position, the first protruding part is at least partially located in the relief space.

In an embodiment of the first aspect, the relief space is provided at each of two sides of the base, the base has a connection part formed between the two relief spaces, a relief recess is provided at a side of the main body part close to the base, and when the swing arm is in the folded position, the connection part is at least partially located in the relief recess.

In an embodiment of the first aspect, the first push part has a first cam surface; and during rotation of the swing arm from the unfolded position to the folded position, the first cam surface forms a cam-follower mate with the first surface.

In an embodiment of the first aspect, the second push part has a second cam surface; and during rotation of the swing arm between the unfolded position and the folded position, the second cam surface forms a cam-follower mate with the second surface.

In an embodiment of the first aspect, when the swing arm is in the folded position, the first push part is in contact with the first surface, and a gap exists between the second push part and the second surface.

In an embodiment of the first aspect, the first push part has a first contact surface; and when the swing arm is in the folded position, the first contact surface is in surface contact with the first surface.

In an embodiment of the first aspect, when the swing arm is in the folded position, the support member is supported on the base.

In an embodiment of the first aspect, when the swing arm is in the unfolded position, the second push part is in contact with the second surface, and a gap exists between the first push part and the first surface.

In an embodiment of the first aspect, the second push part has a second contact surface; and when the swing arm is in the unfolded position, the second contact surface is in surface contact with the second surface.

In an embodiment of the first aspect, the swing arm is provided with a first support part. The first support part, the first push part, and the second push part are arranged in sequence in the direction of the rotation axis of the swing arm; and

- when the swing arm is in the unfolded position, the first support part is located on a side of the support member close to the base to support the support member.

In an embodiment of the first aspect, the first support part has a third contact surface; and when the swing arm is in the unfolded position, the third contact surface is in surface contact with the support member.

In an embodiment of the first aspect, the first support part is not in contact with the support member when the swing arm is in a position between the unfolded position and the folded position.

In an embodiment of the first aspect, the first support part has an inclined surface, the inclined surface is located on a side of a part of the first support part supporting the support member; and when the swing arm is in the unfolded position, the inclined surface is not in contact with the support member and is inclined toward the base from the support member.

In an embodiment of the first aspect, the support member includes a third surface on each of the two sides thereof, and the third surface is configured to contact and be fitted with the first support part;

- when the swing arm is in a position between the unfolded position and the folded position, the first support part is located on a side of the third surface close to the base; and
- in a thickness direction of the support member, a height of the first surface is lower than or equal to a height of the second surface, the height of the first surface is lower than or equal to a height of the third surface, and the thickness direction of the support member is parallel to a direction in which the support member moves toward or away from the base.

In an embodiment of the first aspect, in the thickness direction of the support member, the height of the third surface is lower than or equal to the height of the second surface.

In an embodiment of the first aspect, the support member includes:

- a main body part; and
- third protruding parts, wherein each of the two sides of the main body part is provided with the third protruding part;

the third protruding part includes the third surface on a side thereof close to the base.

In an embodiment of the first aspect, the swing arm is provided with a third recess; when the swing arm is in the folded position, the third protruding part at least partially projects into the third recess; and the first support part is provided on an inner wall and/or an outer edge of the third recess.

In an embodiment of the first aspect, the swing arm is provided with a second support part. The first push part, the second push part, and the second support part are arranged in sequence in the direction of the rotation axis of the swing arm; and when the swing arm is in the unfolded position, the second support part is located on a side of the support member away from the base.

In an embodiment of the first aspect, the second support part is not in contact with the support member when the swing arm is in a position between the unfolded position and the folded position.

In an embodiment of the first aspect, the swing arm is provided with a first limiting part, and the base is provided with first limiting and fitting parts, the first limiting part is configured to abut against the first limiting and fitting part when the swing arm is rotated to the unfolded position so as to prevent continued rotation of the swing arm; and/or the swing arm is provided with a second limiting part, the base is provided with second limiting and fitting parts, the second limiting part is configured to abut against the second limiting and fitting part when the swing arm is rotated to the folded position so as to prevent continued rotation of the swing arm.

In an embodiment of the first aspect, the folding assembly further includes a panel, the panel is disposed on the support member and located on a side of the support member away from the base, a relative position of the panel and the support member is fixed, and the panel and the support member are formed separately.

In an embodiment of the first aspect, the folding assembly further includes a shaft cover, and the base is disposed on the shaft cover and located between the support member and the shaft cover; and the swing arm is provided with a cut-out recess, and when the swing arm is in the unfolded position, the cut-out recess is located on a side of the swing arm close to the shaft cover, and a side edge of the shaft cover projects into the cut-out recess.

According to a second aspect, an embodiment of this application provide a folding apparatus. The folding apparatus includes:

a first housing;

a second housing; and the folding assembly in any one of embodiments of the first aspect, where the first housing is connected to the swing arm on one side of the support member, and the second housing is connected to the swing arm on the other side of the support member.

According to a third aspect, an embodiment of this application provide a terminal device. The terminal device includes:

the folding apparatus in the second aspect; and a foldable screen, disposed on the first housing and the second housing, where a position of a foldable part of the foldable screen corresponds to a position of the support member of the folding assembly.

It may be understood that, for beneficial effects of the second aspect and the third aspect, reference may be made to the related description in the first aspect. Details are not described herein again.

Figure 10A:
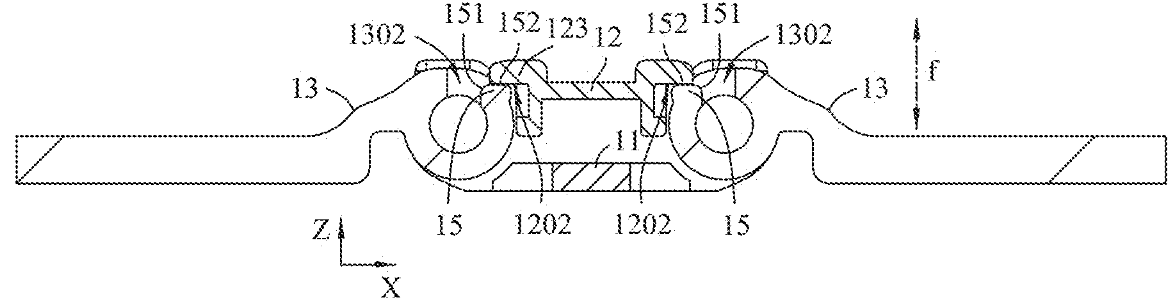
Figure 10B:
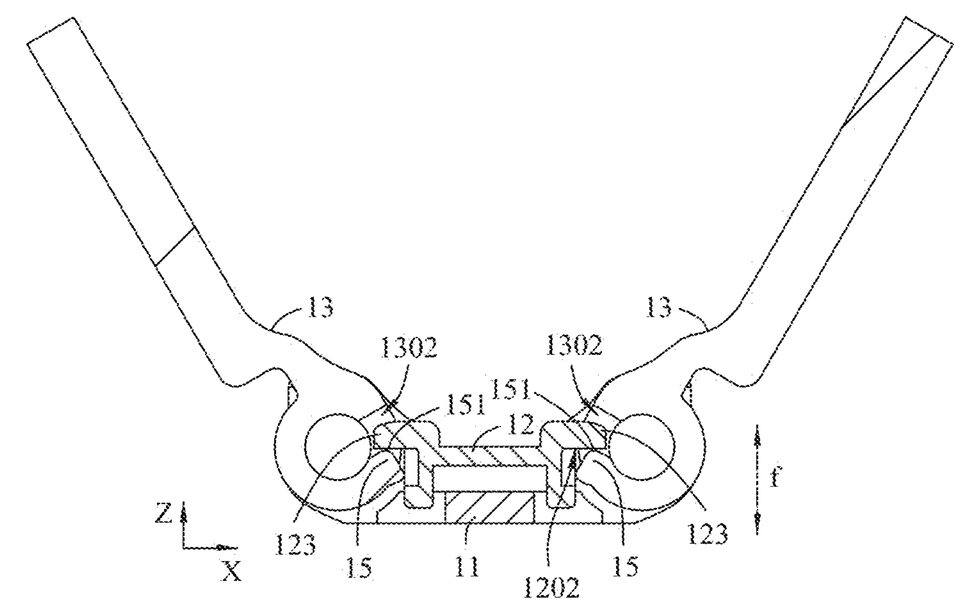
Figure 10C:
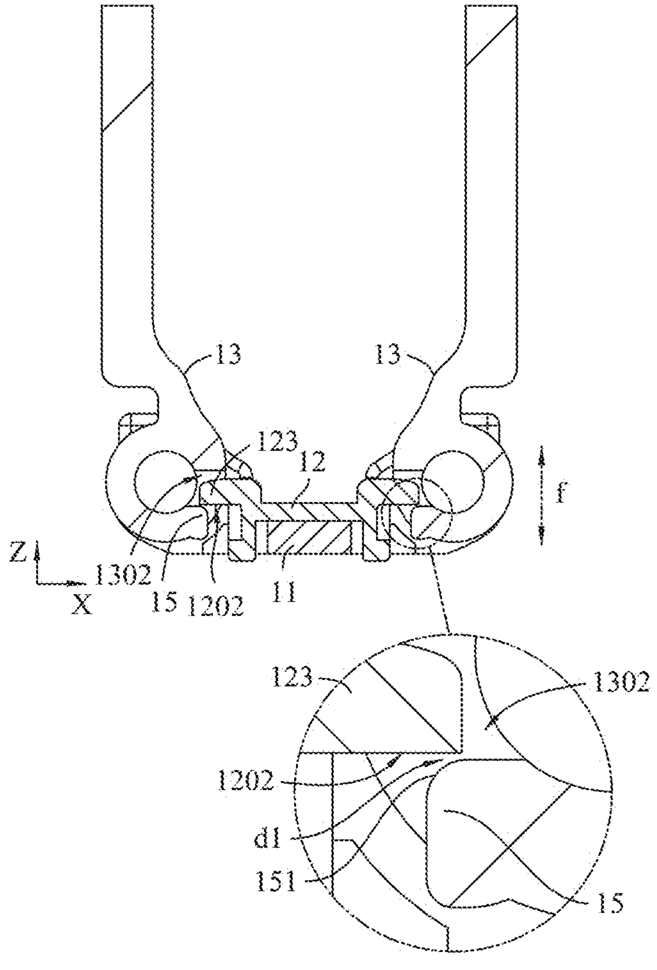
Figure 11:
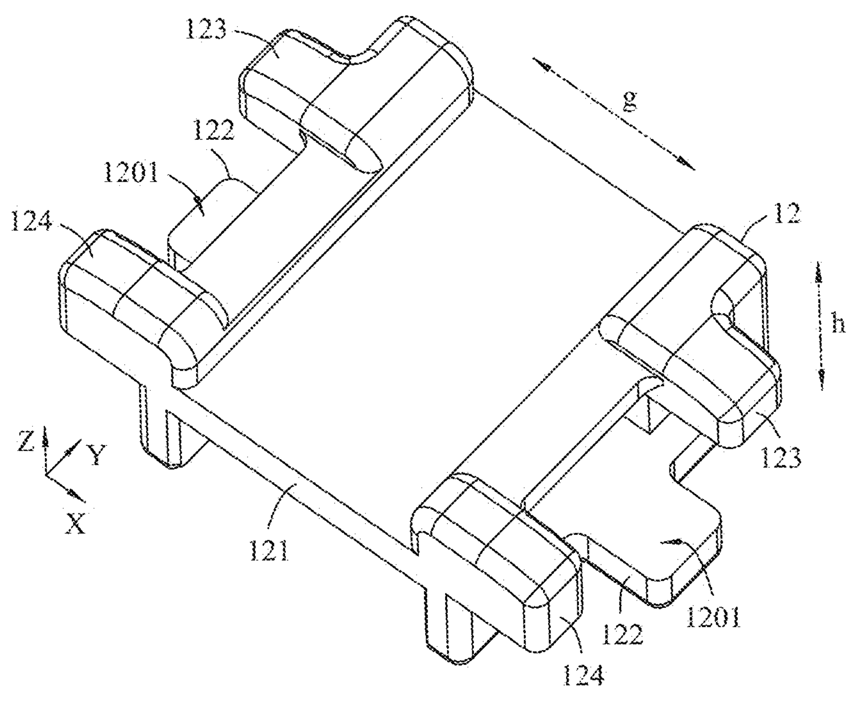
Figure 12:
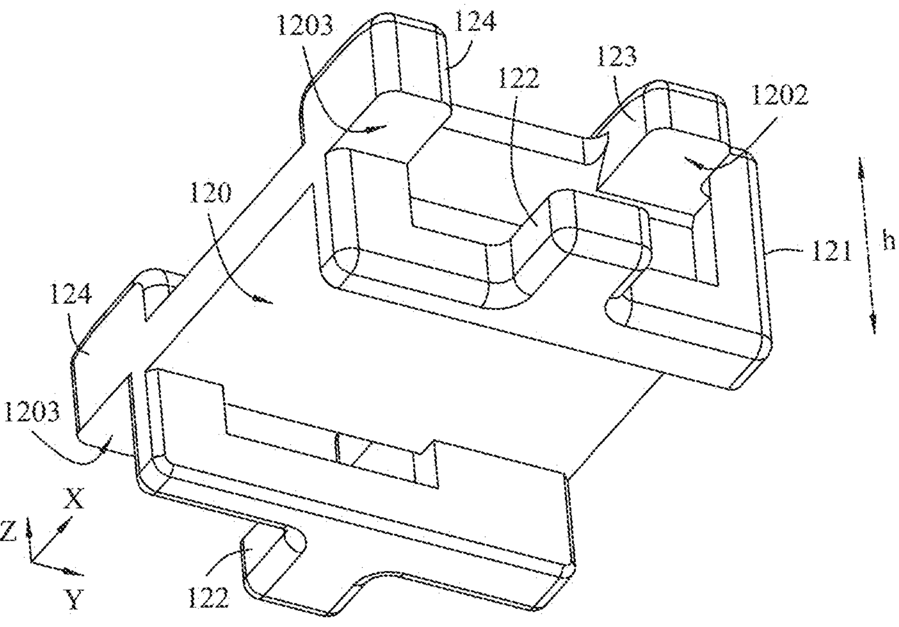
Figure 13:
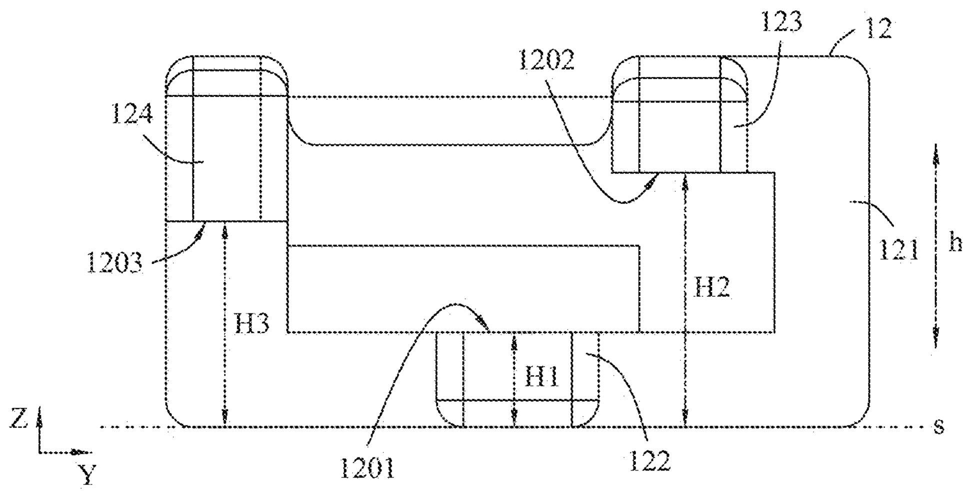
Figure 14:
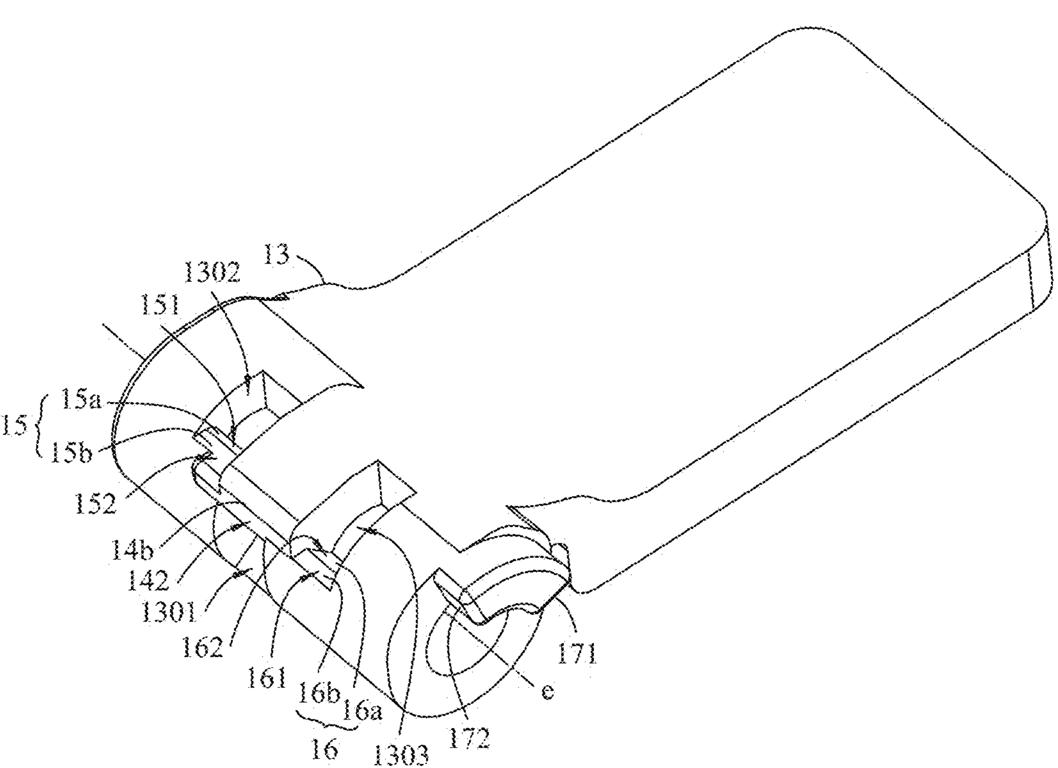
Figures 15, 16:
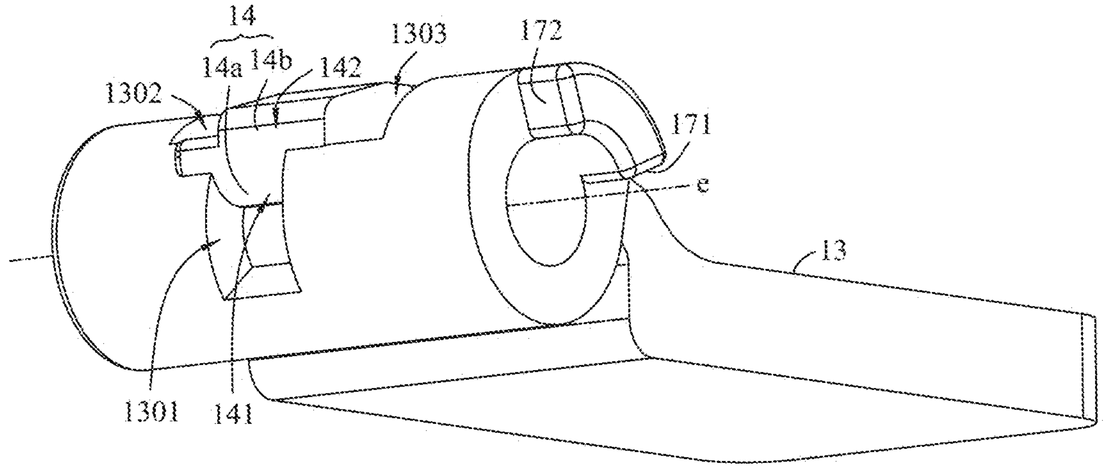
Figures 17, 18:
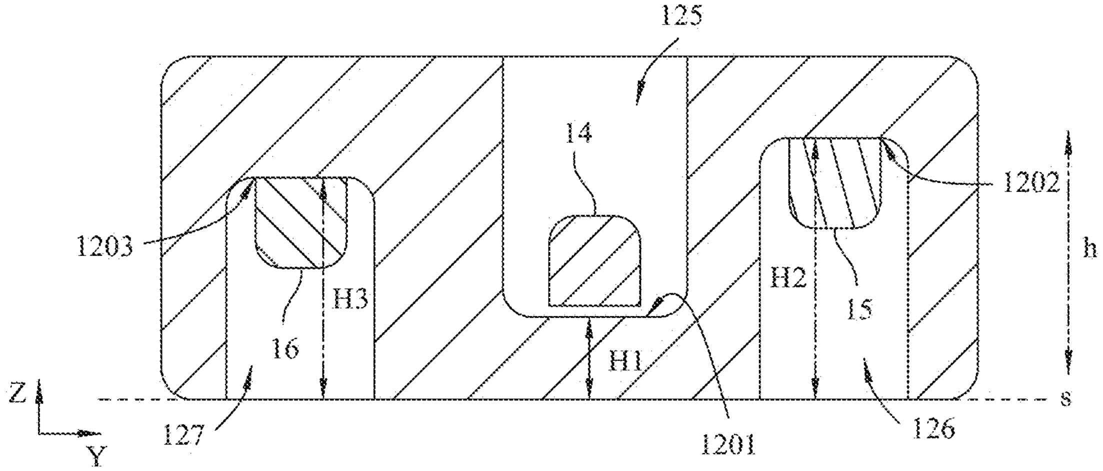
Figure 19:
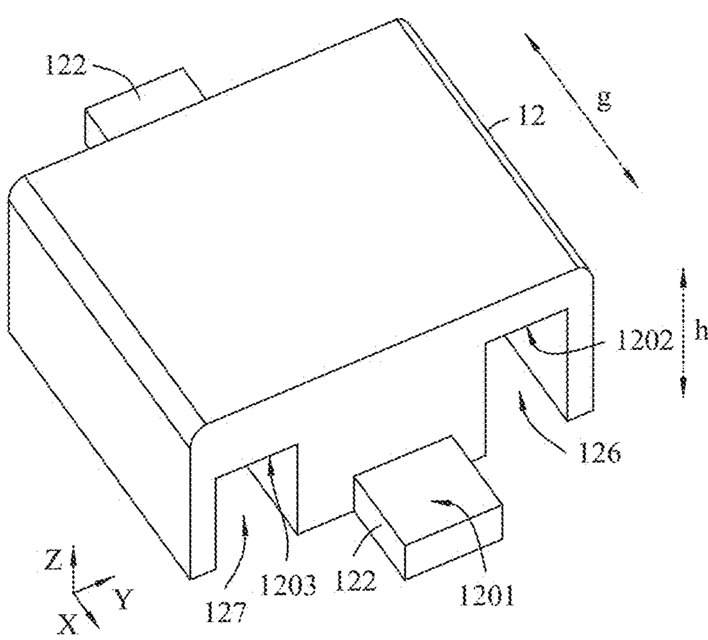
Figure 20:
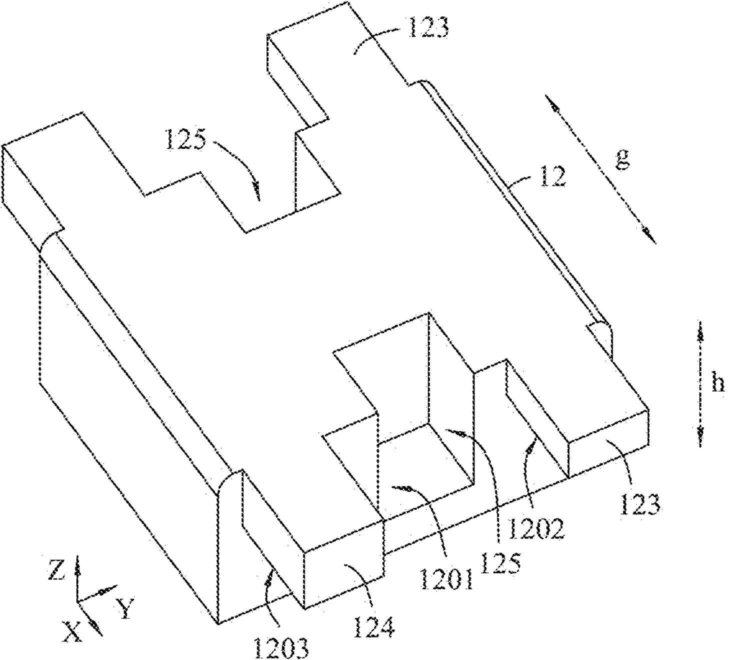
Figure 21A:
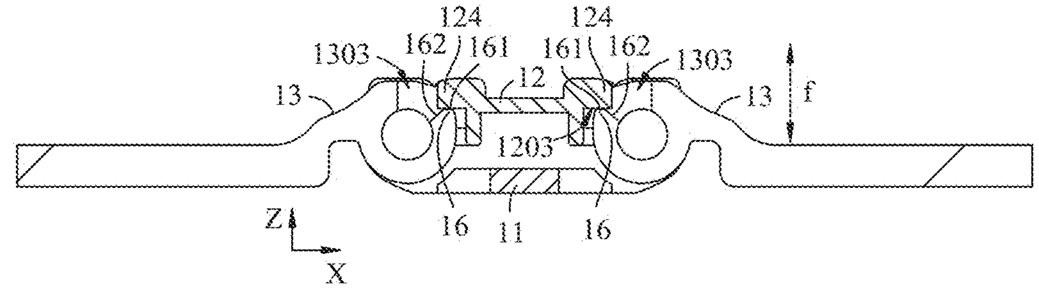
Figure 21B:
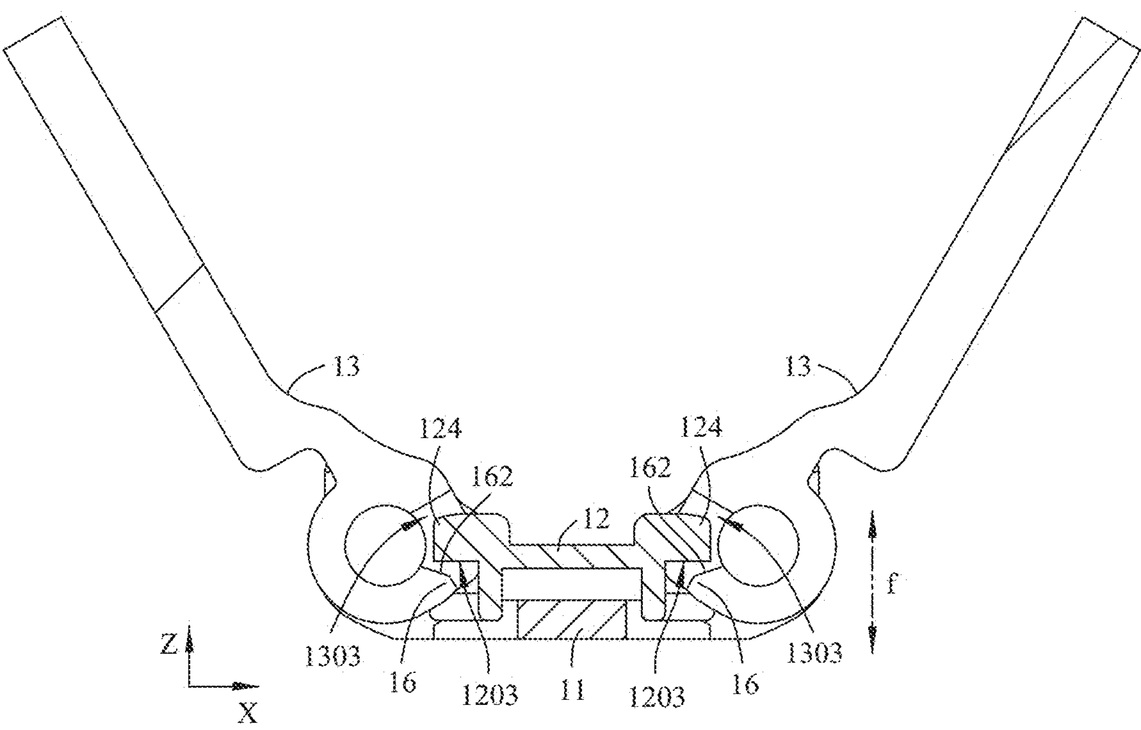
Figure 21C:
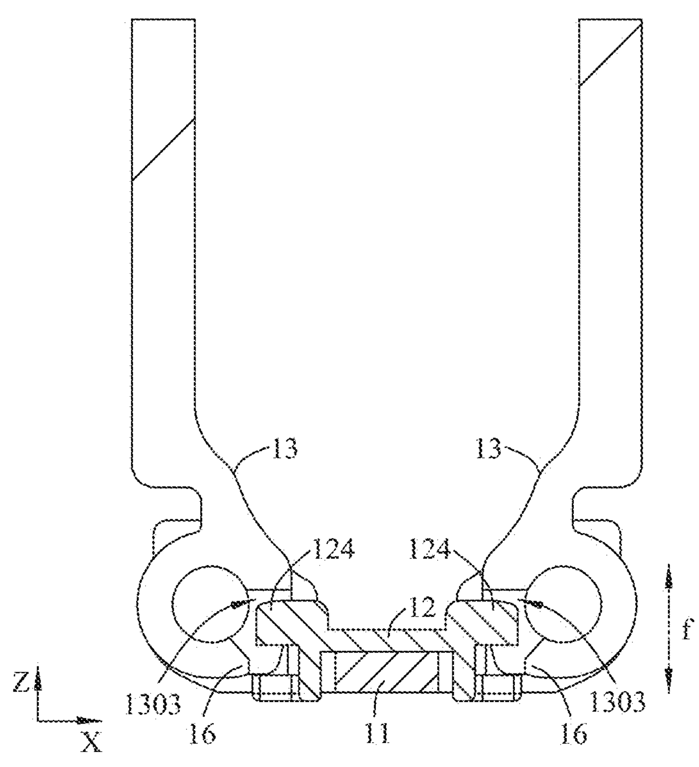
Figure 22:
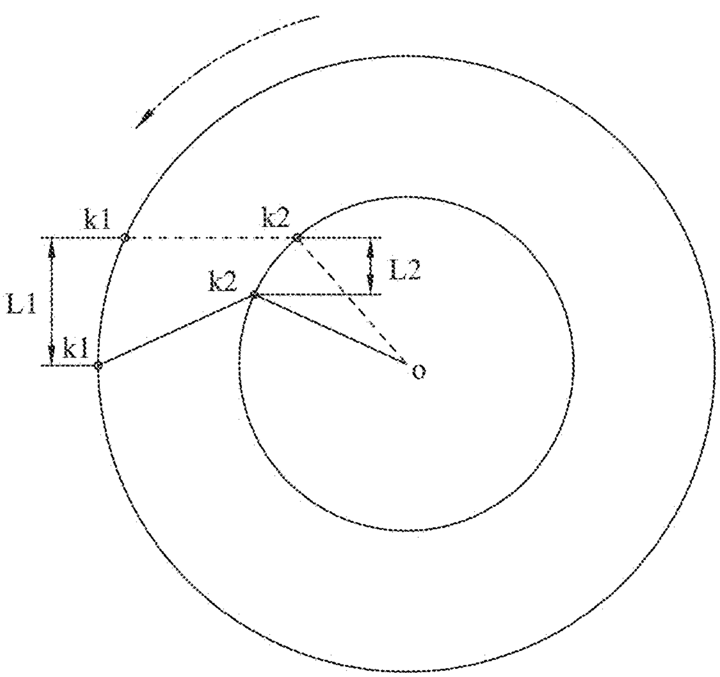
Figure 23:
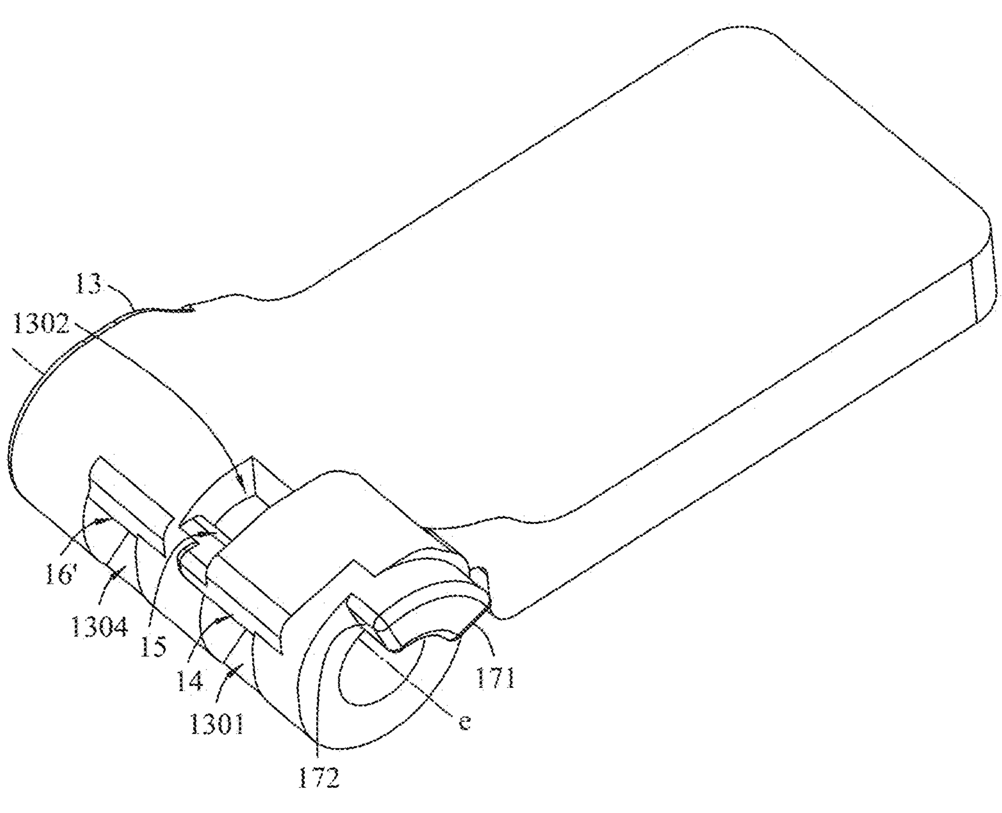
Figure 24:
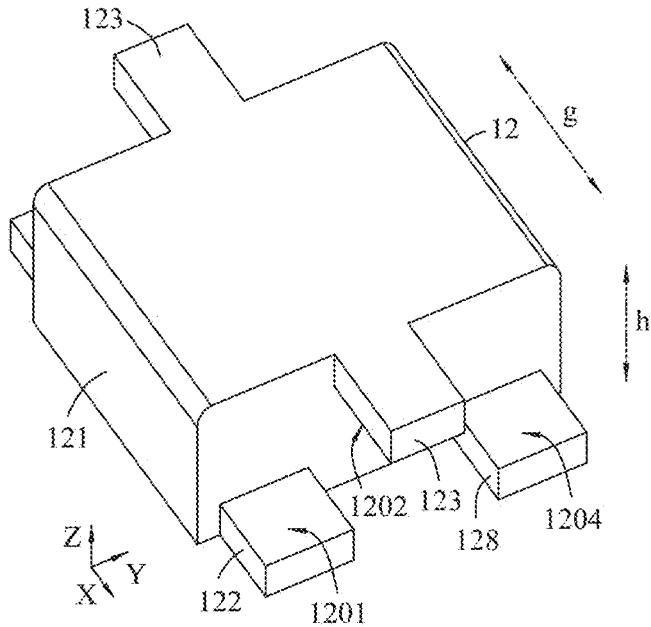
Figure 25:
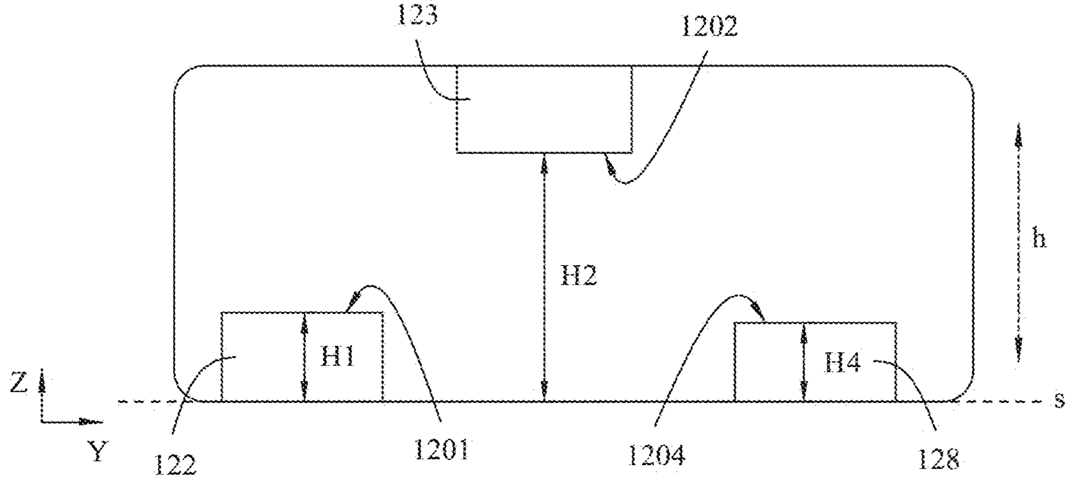
Figure 26:
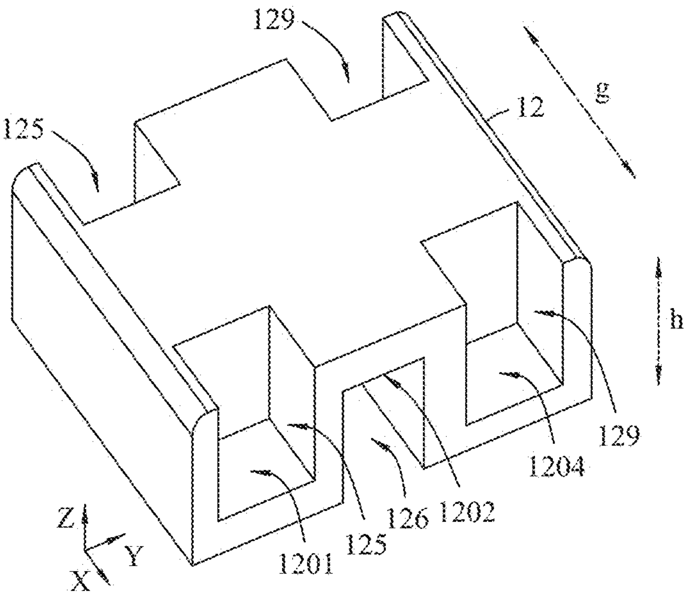
Figure 27:
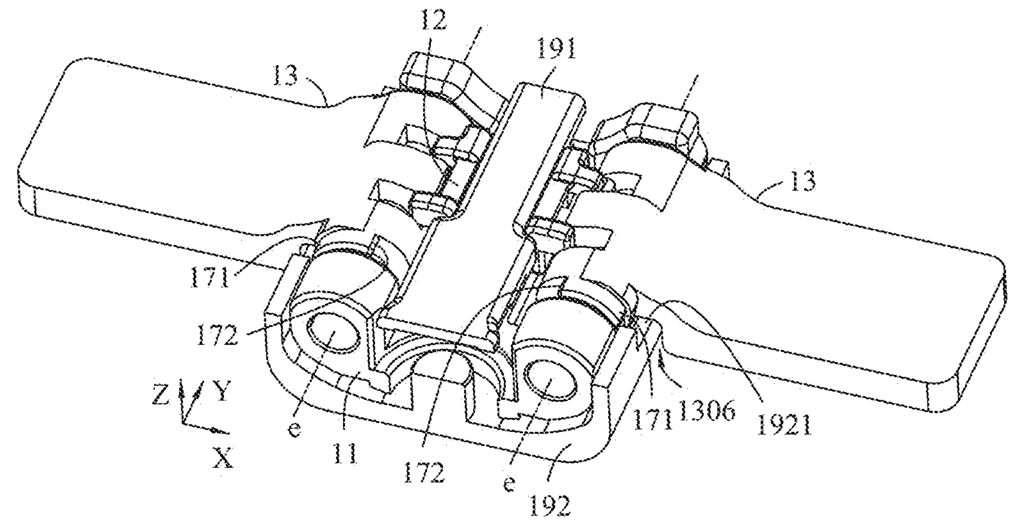
Figure 28:
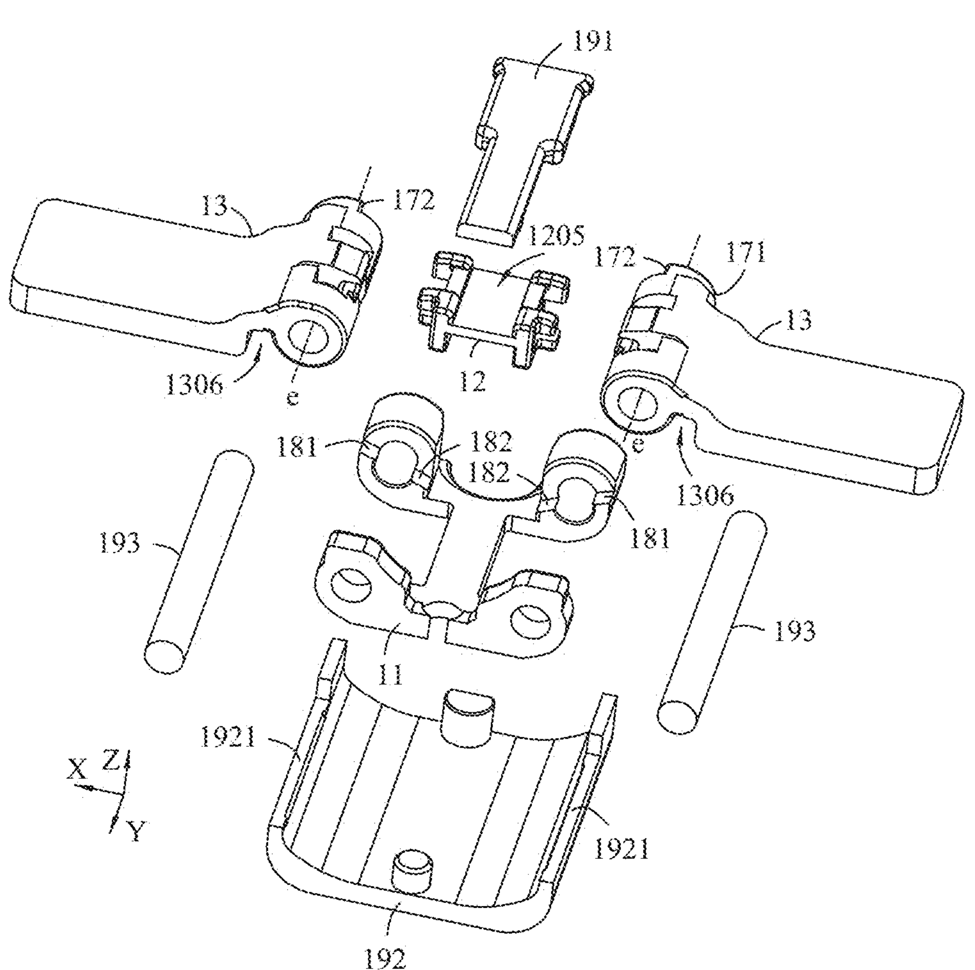

FIG. TOA is a schematic cross-sectional view showing how a second push part works in conjunction with the support member when the swing arm is in the unfolded position according to an embodiment of this application;

FIG. 10B is a schematic cross-sectional view showing how the second push part works in conjunction with the support member when the swing arm is in a position between the unfolded position and the folded position according to an embodiment of this application;

FIG. 10C is a schematic cross-sectional view showing how the second push part works in conjunction with the support member when the swing arm is in the folded position according to an embodiment of this application;

FIG. 11 is a schematic diagram of a structure of a support member according to an embodiment of this application;

FIG. 12 is a schematic diagram of a structure of the support member shown in FIG. 11 from another angle of view;

FIG. 13 is a right view of the support member shown in FIG. 11;

FIG. 14 is a schematic diagram of a structure of a swing arm according to an embodiment of this application;

FIG. 15 is a schematic diagram of a structure of the swing arm shown in FIG. 14 from another angle of view;

FIG. 16 is a schematic diagram of a structure of a support member according to another embodiment of this application;

FIG. 17 is a schematic cross-sectional view showing how the support member shown in FIG. 16 works in conjunction with the first push part, the second push part, and a first support part;

FIG. 18 is a schematic diagram of a structure of a support member according to still another embodiment of this application;

FIG. 19 is a schematic diagram of a structure of a support member according to yet another embodiment of this application;

FIG. 20 is a schematic diagram of a structure of a support member according to still yet another embodiment of this application;

FIG. 21A is a schematic cross-sectional view showing how the first support part works in conjunction with the support member when the swing arm is in the unfolded position according to an embodiment of this application;

FIG. 21B is a schematic cross-sectional view showing how the first support part works in conjunction with the support member when the swing arm is in a position between the unfolded position and the folded position according to an embodiment of this application;

FIG. 21C is a schematic cross-sectional view showing how the first support part works in conjunction with the support member when the swing arm is in the folded position according to an embodiment of this application;

FIG. 22 is a schematic diagram of a relationship between two points rotating by a same angle based on a same axis according to an embodiment of this application;

FIG. 23 is a schematic diagram of a structure of a swing arm according to another embodiment of this application;

FIG. 24 is a schematic diagram of a structure of a support member according to another embodiment of this application;

FIG. 25 is a right view of the support member shown in FIG. 24;

FIG. 26 is a schematic diagram of a structure of a support member according to still another embodiment of this application;

FIG. 27 is a schematic diagram of a structure of a folding assembly according to another embodiment of this application; and FIG. 28 is an exploded view of the folding assembly shown in FIG. 27.

REFERENCE NUMERALS IN THE ACCOMPANYING DRAWINGS

1. electronic device; 01. device body; 02. flexible display; 021. flexible deformable part; 011. folding mechanism; 012. first side plate; 013. second side plate;

0111. fixed base; 0112. sliding column; 0113. limiting plate; 0114. spring; 0115. lifting/lowering plate; 0116. rotatable member;

10. folding assembly; 11. base; 12. support member; 13. swing arm; 14. first push part; 15. second push part; 193. rotation shaft; 1305. shaft through hole; 1102. rotation shaft hole; 111. shaft base; 112. connection part; 1201. first surface; 1202. second surface; 121. main body part; 122. first protruding part; 123. second protruding part; 1301. first recess; 1302. second recess; 1101. relief space; 14*a*. first part; 14*b*. second part; 15*a*. third part; 15*b*. fourth part; 125. first recessed part; 126. second recessed part; 141. first cam surface; 151. second cam surface; 142. first contact surface; 152. second contact surface; 16. first support part; 161. third contact surface; 162. inclined surface; 1203. third surface; 124. third protruding part; 1303. third recess; 16*a*. fifth part; 16*b*. sixth part; 127. third recessed part; 16'. second support part; 128. fourth protruding part; 1204. fourth surface; 1304. fourth recess; 129. fourth recessed part; 171. first limiting part; 181. first limiting and fitting part; 172. second limiting part; 182. second limiting and fitting part; 191. panel; 192. shaft cover; 1306. cut-out recess; 120. relief recess; 1205. limiting recess; 1921. side edge;

100. folding apparatus; 20. first housing; 30. second housing;

1000. terminal device; 200. foldable screen; 210. foldable part.

DESCRIPTION OF EMBODIMENTS

Embodiments of this application are described in detail below, and examples of embodiments are shown in accompanying drawings, where the same or similar elements or the elements having same or similar functions are denoted by the same or similar reference numerals throughout the description. Embodiments described below with reference to the accompanying drawings are examples, and are intended to explain this application and cannot be construed as a limitation to this application.

In the description of this application, it should be understood that orientation or position relationships indicated by the terms such as "length", "width", "thickness", "top", "bottom", "inside", "outside", "up", "down", "left", and "right" are based on orientation or position relationships shown in the accompanying drawings, and are used only for ease and brevity of illustration and description, rather than indicating or implying that the mentioned apparatus or element needs to have a particular orientation or needs to be constructed and operated in a particular orientation. Therefore, such terms should not be construed as a limitation to this application.

The terms such as "first", "second", "third", and "fourth" are merely intended for description, and shall not be understood as an indication or implication of relative importance or implicit indication of the quantity of indicated technical features. For example, a first push part and a second push part are merely intended for distinguishing different push parts, and the sequence of the first push part and the second push part is not limited. The first push part may also be referred to as a second push part, and the second push part may also be referred to as a first push part without departing from the scope of the various described embodiments. In addition, the terms such as "first", "second", "third", and "fourth" do not indicate that the indicated features are necessarily different.

In this application, unless otherwise explicitly specified or defined, the terms such as "connect" and "connection" should be understood in a broad sense. For example, the connection may be a fixed connection, a detachable connection, or an integral connection; or the connection may be a mechanical connection or an electrical connection; or the connection may be a direct connection, an indirect connection through an intermediate medium, internal communication between two components, or an interaction relationship between two components. A person of ordinary skill in the art may understand the specific meanings of the foregoing terms in this application according to specific situations.

In this application, “and/or” only describes an association relationship between associated objects and represents that three relationships may exist. For example, A and/or B may represent the following three cases: Only A exists, both A and B exist, and only B exists. In addition, the character “/” in this specification generally indicates an “or” relationship between the associated objects.

It should be noted that, in this application, the terms such as “in an embodiment”, an “example”, or “for example” is used to represent giving an example, an illustration, or a description. Any embodiment or design scheme described as “in an embodiment”, an “example”, or “for example” in this application should not be explained as being more preferable or having more advantages than another embodiment or design scheme. Exactly, use of the terms such as “in an embodiment”, an “example”, or “for example” is intended to present a related concept in a specific manner.

To make the objectives, technical solutions, and advantages of this application clearer, the following further describes this application in detail with reference to the accompanying drawings and embodiments.

Figures 1, 2:
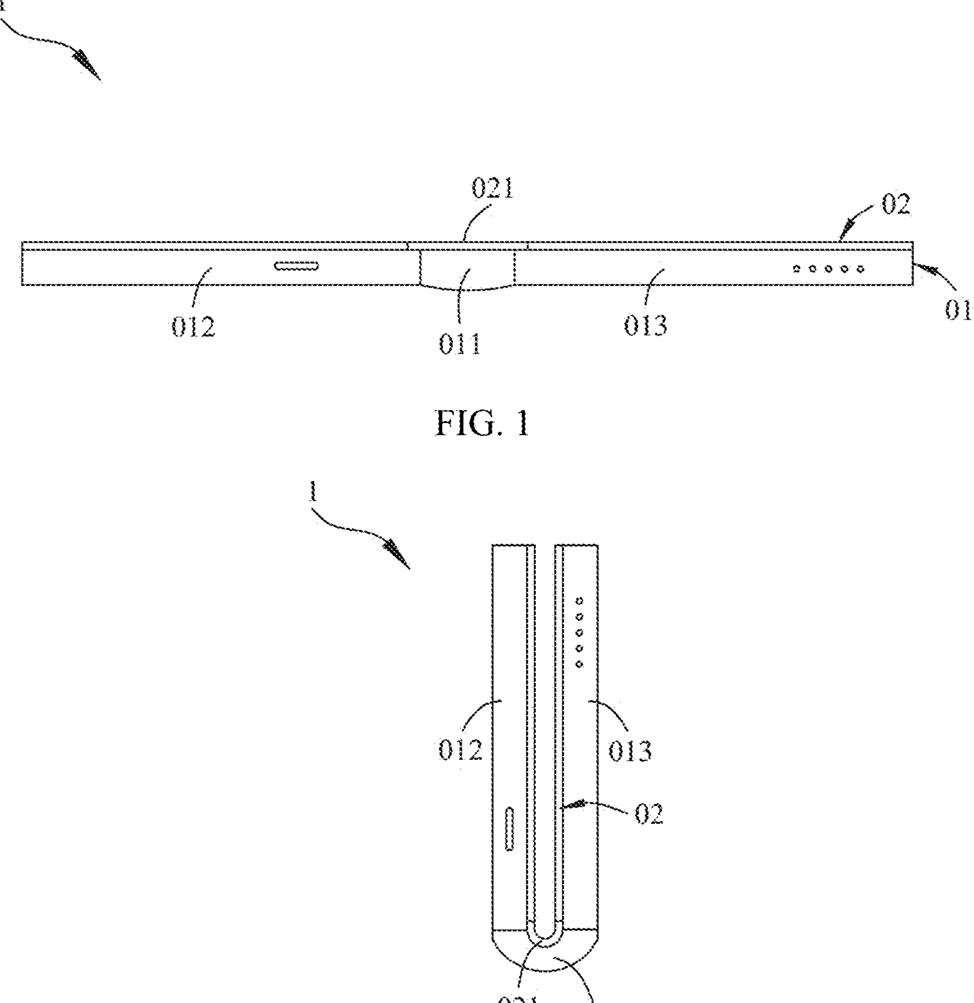
FIG. 1 is a schematic diagram of a structure of an electronic device in an unfolded state provided in the related art.
FIG. 2 is a schematic diagram of a structure of the electronic device in a folded state provided in the related art.

Refer to FIG. 1 and FIG. 2. FIG. 1 is a front view of a foldable electronic device 1 in an unfolded state in the related art. FIG. 2 is a front view of the electronic device 1 shown in FIG. 1 in a folded state. The electronic device 1 includes a device body 01 and a flexible display 02 disposed on the device body 01. The device body 01 includes a folding mechanism 011, a first side plate 012, and a second side plate 013. The first side plate 012 and the second side plate 013 are respectively connected to two sides of the folding mechanism 011 and are rotatable to transition between the folded state and the unfolded state based on the folding mechanism 011. The flexible display 02 is disposed on the first side plate 012 and the second side plate 013 so as to be folded or unfolded as the first side plate 012 and the second side plate 013 rotate.

Comparing FIG. 1 and FIG. 2, it can be learned that when the flexible display 02 is in the folded state, a flexible deformable part 021 of the flexible display 02 bends and protrudes toward a side on which the folding mechanism 011 is located, resulting in a downward movement by a specific distance. Therefore, a specific space is needed to avoid and accommodate the flexible deformable part 021, otherwise the flexible deformable part 021 is prone to interfere with other components of the electronic device 1. However, when the flexible display 02 is in the unfolded state, the flexible deformable part 021 lies substantially flat, and the flexible deformable part 021 needs to be supported, otherwise the flexible deformable part 021 is prone to depression toward the side on which the folding mechanism 011 is located, leading to unsatisfactory user experience.

Figures 3, 4:
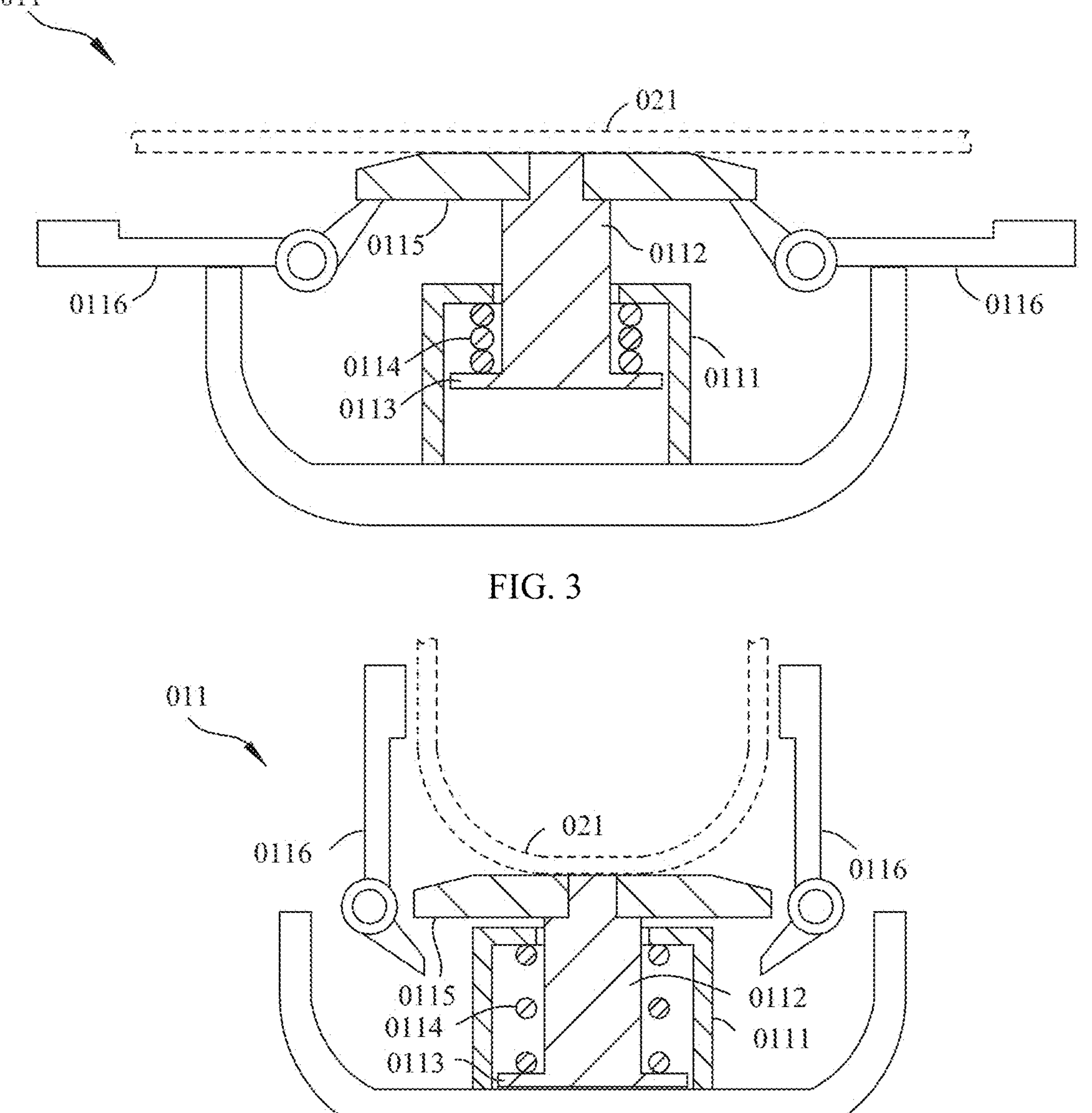
FIG. 3 is a schematic diagram of a structure of a folding mechanism in an unfolded state provided in the related art.
FIG. 4 is a schematic diagram of a structure of the folding mechanism in a folded state provided in the related art.

To resolve the foregoing problem, as shown in FIG. 3 and FIG. 4, FIG. 3 is a schematic diagram of the folding mechanism 011 in the related art supporting the flat flexible deformable part 021. FIG. 4 is a schematic diagram of the folding mechanism 011 in the related art capable of accommodating the bent flexible deformable part 021. The folding mechanism 011 includes a fixed base 0111, a sliding column 0112 that passes through the fixed base 0111 and is vertically movable, a limiting plate 0113 disposed at a bottom end of the sliding column 0112, a spring 0114 that is sleeved on the sliding column 0112 and positionally limited between the fixed base 0111 and the limiting plate 0113, a lifting/lowering plate 0115 disposed at a top end of the sliding column 0112, and two rotatable members 0116 respectively located on two opposite sides of the lifting/lowering plate 0115. The two rotatable members 0116 are rotatable about rotation shafts based on the fixed base 0111. The two rotatable members 0116 are respectively connected to the first side plate 012 and the second side plate 013 so as to rotate together with the first side plate 012 and the second side plate 013 to be in the folded state and the unfolded state.

When the first side plate 012 and the second side plate 013 are in the unfolded state, the two rotatable members 0116 are also in the unfolded state and respectively support two sides of the lifting/lowering plate 0115, the lifting/lowering plate 0115 is lifted to a highest position, and the spring 0114 is compressed under stress. At this time, the lifting/lowering plate 0115 provide support to the flexible deformable part 021, thereby reducing a probability of depression of the flexible deformable part 021. When the first side plate 012 and the second side plate 013 are rotated to transition from the unfolded state to the folded state, the two rotatable members 0116 rotate accordingly and gradually separate from the lifting/lowering plate 0115. The lifting/lowering plate 0115 is lowered gradually under the action of an elastic restoring force of the spring 0114. Then, a space is gradually provided above the lifting/lowering plate 0115 to accommodate the flexible deformable part 021. When the first side plate 012 and the second side plate 013 are in the folded state, the lifting/lowering plate 0115 is lowered to a lowest position, and the bent flexible deformable part 021 is accommodated above the lifting/lowering plate 0115.

In view of the above, to implement the lifting and lowering of the lifting/lowering plate 0115 of the folding mechanism 011 in the related art, many components such as the fixed base 0111, the sliding column 0112, the limiting plate 0113, and the spring 0114 are needed. As a result, the folding mechanism 011 is large in the overall thickness dimension, and occupies large space of the device body 01 in a thickness direction. This hinders the design of a lightweight and thin electronic device 1.

In view of this, embodiments of this application provide a folding assembly, a folding apparatus including the folding assembly, and a terminal device including the folding apparatus, to solve the technical problem in the related art that a folding mechanism occupies large space of the device body in a thickness direction, and reduce the thickness dimension of the folding mechanism, thereby reducing the space of the device body occupied in a thickness direction by the folding mechanism.

The terminal device provided in embodiments of this application is a foldable electronic device, that is, an electronic device can be folded and unfolded. The terminal device may be a mobile phone, a tablet computer, a laptop (Laptop), a notebook personal computer (Notebook PC), a personal digital assistant (Personal Digital Assistant, PDA), a wearable device (such as a watch), a vehicle-mounted device, an augmented reality (Augmented Reality, AR)/virtual reality (Virtual Reality, VR) device, or the like, but is not limited thereto. In this embodiment of this application, description is made by using an example in which the terminal device is a mobile phone.

Figure 5:
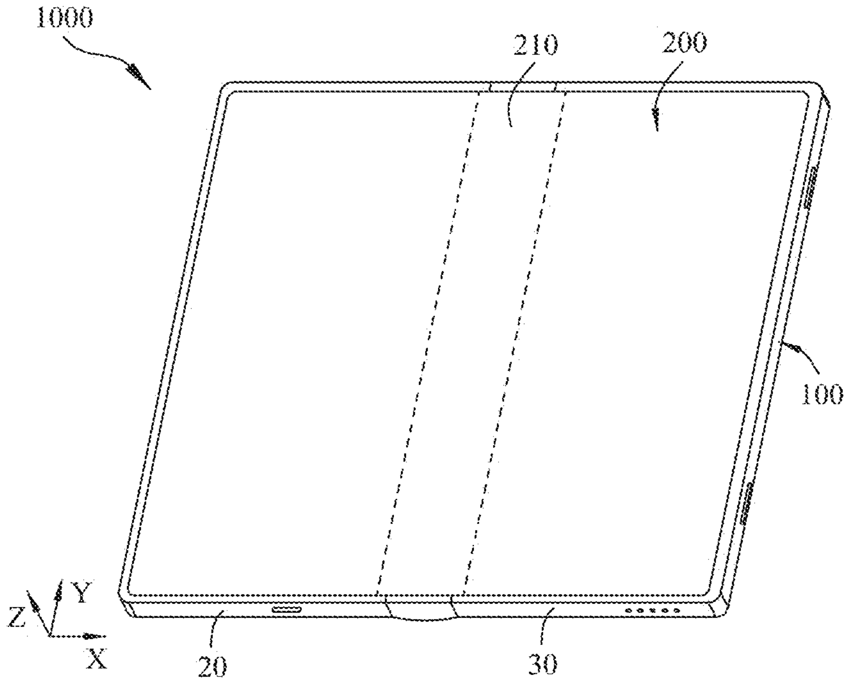
FIG. 5 is a schematic diagram of a structure of a terminal device according to an embodiment of this application.

Refer to FIG. 5. FIG. 5 is a schematic diagram of a structure of a terminal device 1000 in an unfolded state according to an embodiment of this application. The terminal device 1000 includes a folding apparatus 100 and a foldable screen 200. The foldable screen 200 is disposed on the folding apparatus 100. The folding apparatus 100 can provide support and protection for the foldable screen 200 and can be folded and unfolded. The foldable screen 200 is a flexible screen and can be folded and unfolded along with the folding apparatus 100.

Figure 6:
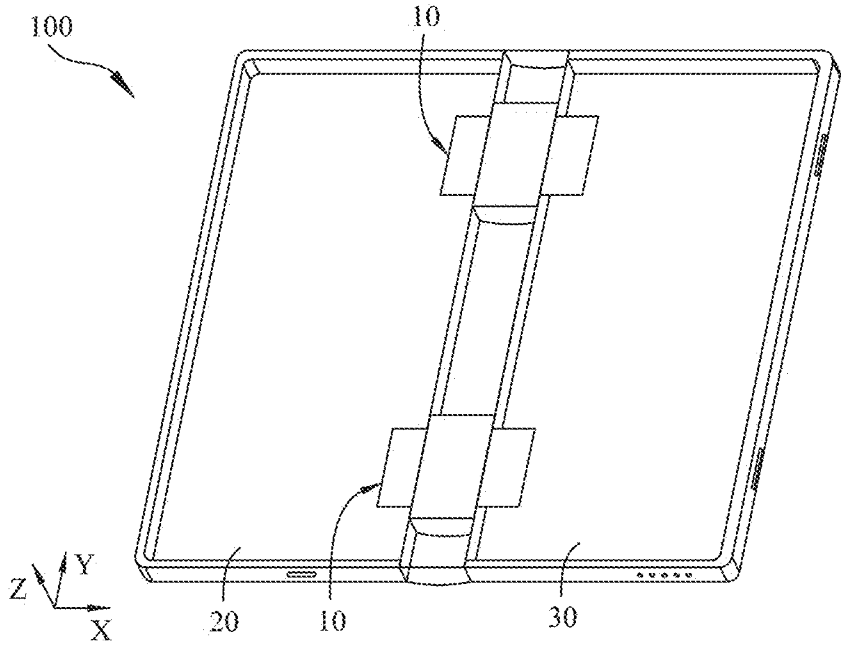
FIG. 6 is a schematic diagram of a structure of a folding apparatus according to an embodiment of this application.

Refer to FIG. 6. FIG. 6 is a schematic diagram of a structure of a folding apparatus 100 according to an embodiment of this application. The folding apparatus 100 includes a folding assembly 10, a first housing 20, and a second housing 30. The folding assembly 10 is located between the first housing 20 and the second housing 30 and is connected to the first housing 20 and the second housing 30 separately. The first housing 20 and the second housing 30 are rotatable relative to each other based on the folding assembly 10 to get close to each other to be rotated to a folded position (where FIG. 6 illustrates the first housing 20 and the second housing 30 in an unfolded position), or to move away from each other to be rotated to the unfolded position.

It may be understood that there may be one or more folding assemblies 10. When there are a plurality of folding assemblies 10, the folding assemblies 10 may be arranged at intervals in sequence and be located between the first housing 20 and the second housing 30.

Still refer to FIG. 5 and FIG. 6. The foldable screen 200 is disposed on the first housing 20 and the second housing 30 and can be folded and unfolded as the first housing 20 and the second housing 30 rotate. The foldable screen 200 has a foldable part 210. The foldable part 210 is substantially located between the first housing 20 and the second housing 30 to correspond to the folding assembly 10. The foldable part 210 is flexible, so that when the first housing 20 and the second housing 30 rotate relative to each other, the foldable screen 200 can be folded as the foldable part 210 is bent. It may be understood that a part of the foldable screen 200 corresponding to the first housing 20 may be flexible or rigid, and a part of the foldable screen 200 corresponding to the second housing 30 may be flexible or rigid.

For example, the foldable screen 200 is an inward-foldable screen (after the foldable screen is folded, a display surface of the foldable screen is located on the inner side). Aback surface of the foldable screen 200 is arranged on the first housing 20 and the second housing 30. The display surface of the foldable screen 200 is exposed. The display surface of the foldable screen 200 is a surface for displaying images, and the back surface of the foldable screen 200 is the other surface opposite to the display surface.

When the first housing 20 and the second housing 30 are in the unfolded position (that is, the terminal device 1000 is in the unfolded state), the first housing 20 and the second housing 30 are substantially on a same plane. In other words, an included angle between the first housing 20 and the second housing 30 is approximately 180°. At this time, the foldable screen 200 is in a substantially flat unfolded state, so that the terminal device 1000 has a large display area. It should be understood that when the first housing 20 and the second housing 30 are in the unfolded position, the included angle between the first housing 20 and the second housing 30 is not limited to an absolute 180°. The included angle between the first housing 20 and the second housing 30 may alternatively be greater than or less than 180°, but close to 180°. For example, the included angle may range from 1650 to 1900 (for example, 170°, 173°, 175°, 182°, or 185°, but not limited thereto). In this case, the foldable screen 200 can also be unfolded.

When the first housing 20 and the second housing 30 are in the folded position (that is, the terminal device 1000 is in the folded state), the first housing 20 and the second housing 30 are substantially parallel. In other words, the included angle between the first housing 20 and the second housing 30 is approximately 0°. At this time, the foldable screen 200 is folded with respect to the foldable part 210 to be in a folded state and located between the first housing 20 and the second housing 30, so as to facilitate the storage of the terminal device 1000 and reduce a probability of damage of the foldable screen 200 by external force. It should be understood that when the first housing 20 and the second housing 30 are in the folded position, the first housing 20 and the second housing 30 are not necessarily absolutely parallel. The included angle between the first housing 20 and the second housing 30 may alternatively be greater than 0°, but close to 0°. For example, the included angle may range from 0° to 15° (for example, 1, 2°, 3°, 5°, or 10°, but not limited thereto). In this case, the foldable screen 200 can also be folded.

The folding assembly 10 provided in embodiments of this application is described below.

To facilitate the description of the following embodiments, an XYZ coordinate system is established, A width direction of the folding assembly 10 is defined as an X-axis direction and may also be regarded as a direction pointing to the second housing 30 from the first housing 20 when the terminal device 1000 is in the unfolded state. A length direction of the folding assembly 10 is defined as a Y-axis direction and may also be regarded as a direction pointing to an upper edge of the first housing 20 from a lower edge of the first housing 20 when the terminal device 1000 is in the unfolded state. A thickness direction of the folding assembly 10 is defined as a Z-axis direction and may also be regarded as a direction pointing to the foldable screen 200 from the back surface of the first housing 20 when the terminal device 1000 is in the unfolded state, that is, a thickness direction of the terminal device 1000. It may be understood that the coordinate system of the folding assembly 10 may be flexibly set based on an actual requirement. The coordinate system provided in this application is merely an example and cannot be considered as a special limitation to this application.

Figure 7A:
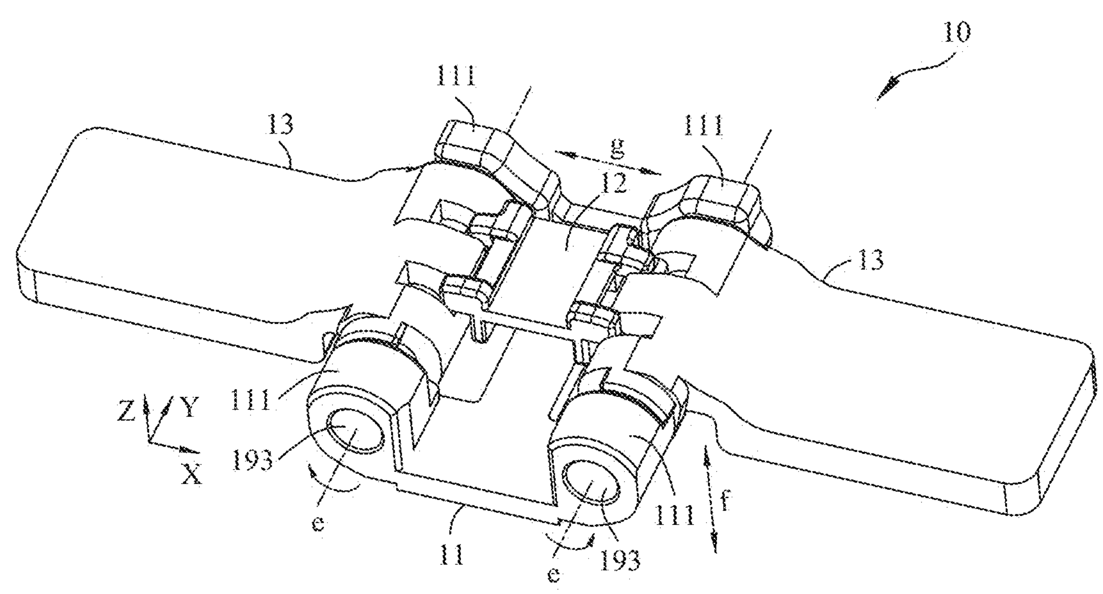
FIG. 7A is a schematic diagram of a structure of a folding assembly in an unfolded state according to an embodiment of this application.
Figure 7B:
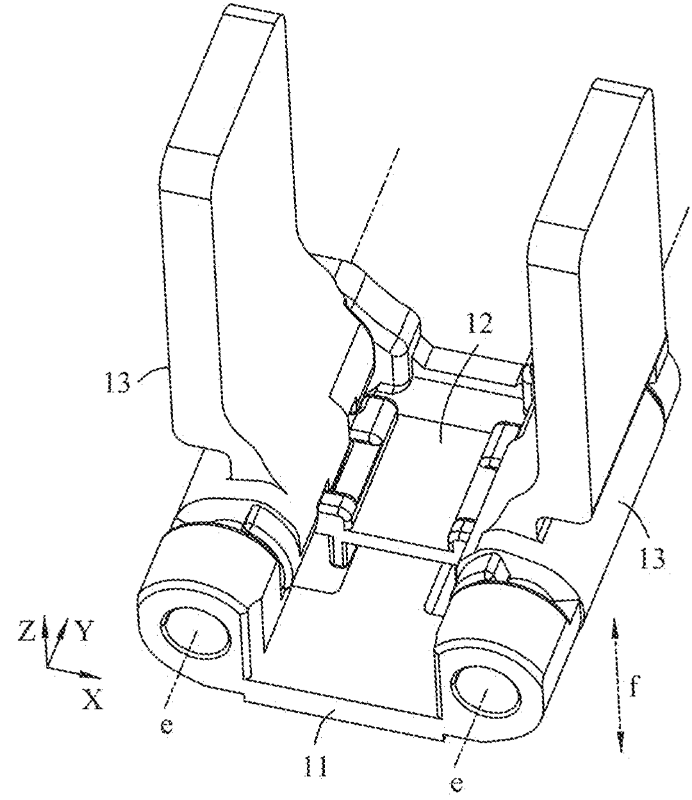
FIG. 7B is a schematic diagram of a structure of the folding assembly in a folded state according to an embodiment of this application.
Figure 8:
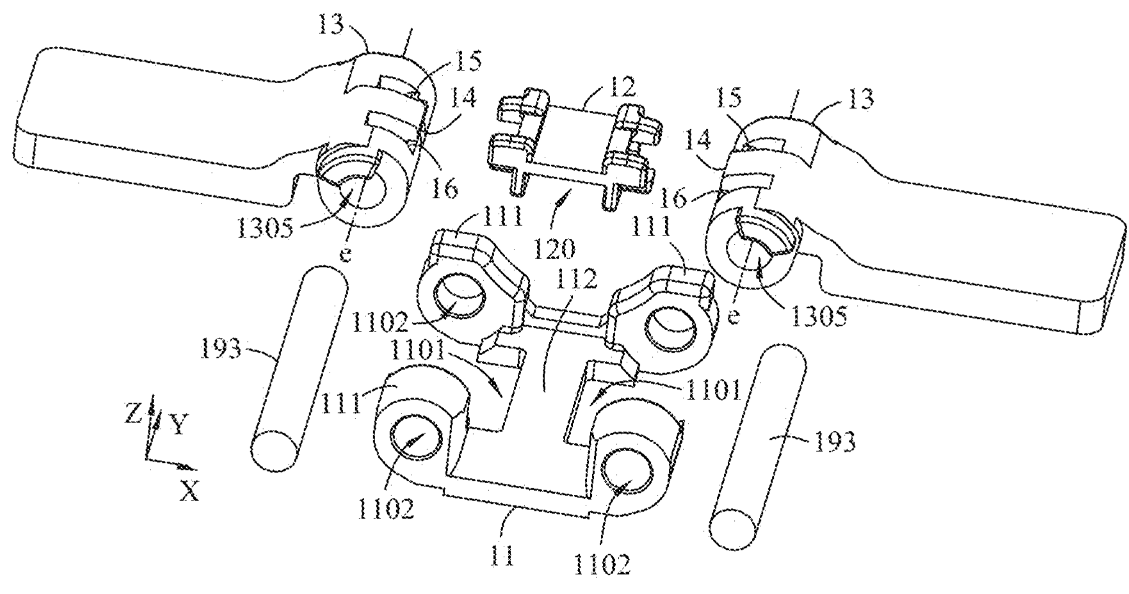
FIG. 8 is an exploded view of the folding assembly shown in FIG. 7A.

Still refer to FIG. 7A to FIG. 8. FIG. 7A is a schematic diagram of a structure of a folding assembly 10 in an unfolded state according to an embodiment of this application. FIG. 7B is a schematic diagram of a structure of the folding assembly 10 in a folded state according to an embodiment of this application. FIG. 8 is an exploded view of the folding assembly 10 shown in FIG. 7A. The folding assembly 10 includes a base 11, a support member 12, and at least two swing arms 13.

The base 11 is for mounting the swing arms 13 and can support the swing arms 13. The base 11 is also referred to as a base or a shaft cover base. It may be understood that the base 11 may be a structure in various shapes, such as a plate structure, a frame structure, or a block-shaped structure, but is not limited thereto, and may alternatively another structure of a regular shape or an irregular shape, provided that the swing arms 13 can be mounted. This is not uniquely limited herein.

The support member 12 is located on one side of the base 11 and is movable toward or away from the base 11. FIG. 7A shows an example case in which the support member 12 is located above the base 11. A position of the support member 12 corresponds to a position of the foldable part 210 of the foldable screen 200. When the support member 12 moves toward the base 11, that is, the support member 12 is lowered, space is provided on a side of the support member 12 away from the base to accommodate the bent foldable part 210. When the support member 12 moves away from the base 11, that is, the support member 12 is lifted, the side of the support member 12 away from the base may support the unfolded foldable part 210.

It may be understood that the support member 12 may be a structure in various shapes, such as a frame structure, a plate structure, a block-shaped structure, or a sheet structure, but is not limited thereto, and may alternatively be another structure of a regular shape or an irregular shape, provided that the support member 12 can support objects and can be fitted with the first push part 14 and the second push part 15 described below. This is not uniquely limited herein.

The at least two swing arms 13 are respectively arranged on two sides of the support member 12. To be specific, there are swing arms 13 on the two sides of the support member 12, and there are one or more swing arms 13 on each side. The swing arms 13 are rotatably connected to the base 11 to enable each swing arm 13 to be rotatable with respect to the base 11 between an unfolded position and a folded position. The swing arms 13 on the two sides of the support member 12 are configured to be connected to the first housing 20 and the second housing 30 respectively, so as to rotate along with the first housing 20 and the second housing 30 to the unfolded position or the folded position. To be specific, the first housing 20 is connected to the swing arm 13 on one side of the support member 12, and the second housing 30 is connected to the swing arm 13 on the other side of the support member 12. Rotation axes e of the swing arms 13 on the two sides of the support member 12 may be set to be substantially parallel. Certainly, a specific deviation is allowed, and the rotation axes are approximately parallel. In other words, manufacturing and assembly errors and the like are allowed. The rotation axis e may be substantially parallel to the Y-axis direction.

Figure 9A:
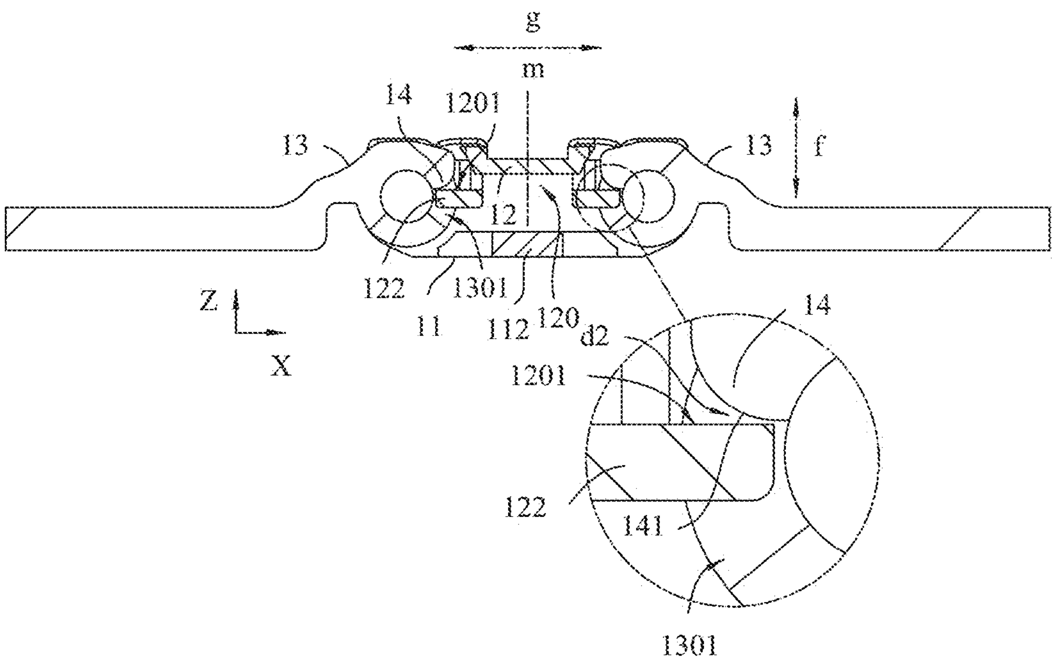
FIG. 9A is a schematic cross-sectional view showing how a first push part works in conjunction with a support member when a swing arm is in an unfolded position according to an embodiment of this application.

It should be noted that the two sides of the support member 12 are two sides of an interface of a longitudinal section m of the support member 12. The two sides may be two opposite sides (that is, the two sides aligned with each other), or may be two sides that are not aligned with each other (that is, the two sides are misaligned by a specific distance in a thickness direction h of the support member 12 but not aligned with each other). The longitudinal section m is a plane parallel to the thickness direction h of the support member 12 and bisects the support member 12 in a width direction g of the support member 12, for example, as shown in FIG. 9A. The thickness direction h of the support member 12 is parallel to a direction f in which the support member 12 moves toward or away from the base 11 and parallel to the Z-axis direction. The thickness direction h of the support member 12 may also be regarded as a height direction of the support member 12. The width direction g of the support member 12 is perpendicular to the thickness direction h of the support member 12 and the direction of the rotation axis e of the swing arm 13. The width direction g of the support member 12 is also parallel to the X-axis direction. By analogy, two sides of a component described below are the two sides of an interface of a longitudinal section of the component.

It may be understood that when the swing arms 13 on the two sides of the support member 12 is in the unfolded position (for example, as shown in FIG. 7A), the first housing 20 and the second housing 30 are also in the unfolded position, and an included angle between the swing arms 13 on the two sides of the support member 12 is also substantially 180°. Certainly, there may be a specific deviation from 180°. For example, the included angle may range from 165° to 190° (for example, 170°, 173°, 175°, 182°, or 185°, but not limited thereto). Similarly, when the swing arms 13 on the two sides of the support member 12 are in the folded position (for example, as shown in FIG. 7B), the first housing 20 and the second housing 30 are also in the folded position. The swing arms 13 on the two sides of the support member 12 may be substantially parallel. In other words, the included angle between the swing arms 13 on the two sides of the support member 12 is approximately 0°. Certainly, there may alternatively be a small included angle between the swing arms 13 on the two sides of the support member 12. For example, the included angle may range from 0° to 15° (for example 1, 2°, 3°, 5°, or 10°, but not limited thereto).

It should be understood that the swing arm 13 may be a swing arm structure in various shapes. A main function of both the swing arms 13 on the two sides of the support member 12 is to rotate with respect to the base 11. For convenience of description, the two swing arms are referred to as swing arms, but the shapes and structures of the swing arms 13 on the two sides of the support member 12 may be the same or different. This is not uniquely limited in embodiments of this application.

Refer to FIG. 8. The first push part 14 and the second push part 15 are provided on each of the swing arms 13 on the two sides of the support member 12. The first push part 14 and the second push part 15 on a same swing arm 13 are arranged in sequence in a direction of the rotation axis e of the swing arm 13. In other words, in the direction of the rotation axis e of the swing arm 13, the first push part 14 and the second push part 15 are staggered rather than at a same position. It may be understood that in the direction of the rotation axis e of the swing arm 13, the first push part 14 and the second push part 15 may be completely staggered. In other words, projection of the first push part 14 does not overlap projection of the second push part 15 in a direction perpendicular to the direction of the rotation axis e. Certainly, in some other embodiments, the first push part 14 and the second push part 15 may alternatively be partially staggered in the direction of the rotation axis e of the swing arm 13. In other words, the projection of the first push part 14 partially overlap the second push part 15 in a direction perpendicular to the direction of the rotation axis e.

Figure 9B:
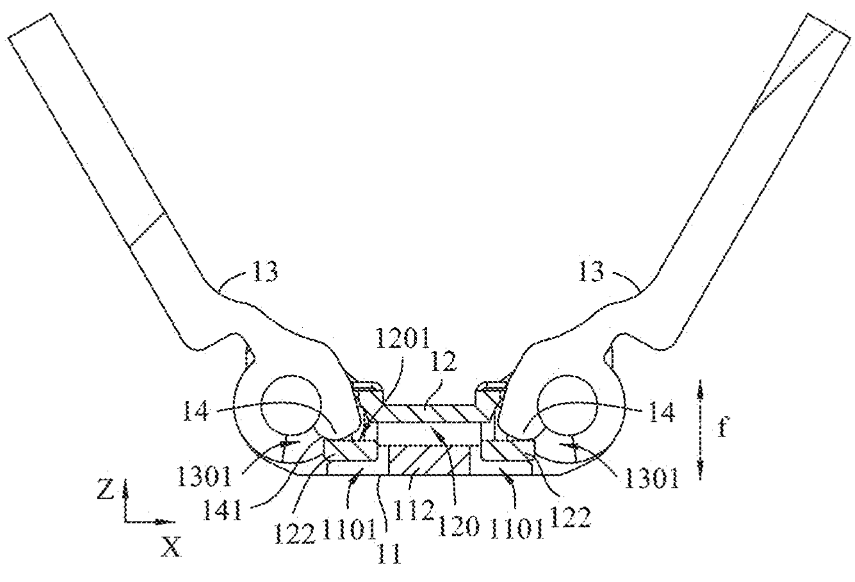
FIG. 9B is a schematic cross-sectional view showing how the first push part works in conjunction with the support member when the swing arm is in a position between the unfolded position and a folded position according to an embodiment of this application.
Figure 9C:
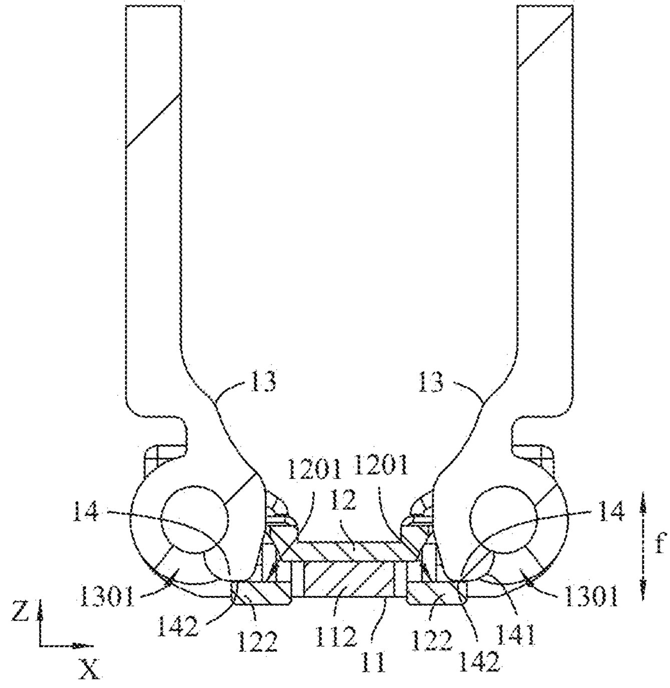
FIG. 9C is a schematic cross-sectional view how the first push part works in conjunction with the support member when the swing arm is in the folded position according to an embodiment of this application.

Refer to FIG. 9A and FIG. 10C. FIG. 9A is a schematic cross-sectional view showing how a first push part 14 works in conjunction with the support member 12 when the swing arm 13 is in an unfolded position. FIG. 9B is a schematic cross-sectional view showing how the first push part 14 works in conjunction with the support member 12 when the swing arm 13 is in a position between the unfolded position and a folded position. FIG. 9C is a schematic cross-sectional view how the first push part 14 works in conjunction with the support member 12 when the swing arm 13 is in the folded position. FIG. 10A is a schematic cross-sectional view showing how the second push part 15 works in conjunction with the support member 12 when the swing arm 13 is in the unfolded position. FIG. 10B is a schematic cross-sectional view showing how the second push part 15 works in conjunction with the support member 12 when the swing arm 13 is in a position between the unfolded position and the folded position. FIG. 10C is a schematic cross-sectional view showing how the second push part 15 works in conjunction with the support member 12 when the swing arm 13 is in the folded position.

Refer to FIG. 11 and FIG. 12. FIG. 11 is a schematic diagram of a three-dimensional structure of a support member 12 according to an embodiment of this application. FIG. 12 is a schematic diagram of a three-dimensional structure of the support member 12 shown in FIG. 11 from another angle of view. Meanwhile, refer to FIG. 7A and FIG. 8. The support member 12 includes first surfaces 1201 and second surfaces 1202. Each first surface 1201 is arranged corresponding to the first push part 14. To be specific, a position of the first surface 1201 corresponds to a position of the first push part 14. Therefore, during rotation of the swing arm 13, the first push part 14 and the first surface 1201 can be in contact with each other, and the position of each first push part 14 may correspond to the position of each first surface 1201. The second surface 1202 is arranged corresponding to the second push part 15. To be specific, a position of the second surface 1202 corresponds to a position of the second push part 15. Therefore, during rotation of the swing arm 13, the second push part 15 and the second surface 1202 can be in contact with each other, and the position of each second push part 15 may correspond to the position of each second surface 1202. It may be understood that the first surface 1201 and the second surface 1202 may be a flat surface, a curved surface, or a folded surface (where the folded surface is a surface with a fold line or a bent surface).

Refer to FIG. 9A, FIG. 9B, and FIG. 9C in sequence. During rotation of the swing arm 13 from the unfolded position to the folded position, the swing arm 13 drives the first push part 14 to rotate together, and the first push part 14 rotates toward the base 11 to cause the first push part 14 to abut against the first surface 1201, so as to push the support member 12 to move toward the base 11, that is, push the support member 12 to be lowered down. Refer to FIG. 10C, FIG. 10B, and FIG. 10A in sequence. During rotation of the swing arm 13 from the folded position to the unfolded position, the swing arm 13 drives the second push part 15 to rotate together, and the second push part 15 rotates away from the base 11 to cause the second push part 15 to abut against the second surface 1202, so as to push the support member 12 to move away from the base 11, that is, push the support member 12 to be lifted up.

It may be understood that the first push part 14 may be a structure in various shapes that can push an object to move. For example, the first push part 14 may be a protruding structure or a planar structure on the swing arm 13, or may be a rod-shaped structure, a block-shaped structure, a columnar structure, or a hook-like structure, but is not limited thereto. In addition, the first push part 14 may be a rigid structure or an elastic structure capable of elastic deformation. Similarly, the second push part 15 may be a structure in various shapes that can push an object to move. For example, the second push part 15 may be a protruding structure or a planar structure on the swing arm 13, or may be a rod-shaped structure, a block-shaped structure, a columnar structure, or a hook-like structure, but is not limited thereto. In addition, the second push part 15 may be a rigid structure or an elastic structure capable of elastic deformation.

In view of the above, in the folding assembly 10 provided in embodiments of this application, because the swing arm 13 is provided with the first push part 14 and the second push part 15, during rotation of the swing arm 13 from the unfolded position to the folded position, the swing arm 13 may drive both the first push part 14 and the second push part 15 to rotate toward the base 11. Therefore, the first push part 14 may abut against the first surface 1201 to push the support member 12 to move toward the base 11, thereby providing space on the side of the support member 12 away from the base 11 to accommodate the bent foldable part 210, while the second push part 15 does not hinder the lowering of the support member 12. During rotation of the swing arm 13 from the folded position to the unfolded position, the swing arm 13 may drive both the first push part 14 and the second push part 15 to rotate away from the base 11. Therefore, the second push part 15 may abut against the second surface 1202 to push the support member 12 to move away from the base 11, so that the support member 12 supports the foldable part 210 in a flat state, thereby effectively reducing a probability of depression of the foldable part 210 when the foldable screen 200 is in the unfolded state, while the first push part 14 does not hinder the lifting of the support member 12. In this way, the movement of the support member 12 toward and away from the base 11 can be controlled through the rotation of the swing arm 13, the first push part 14, and the second push part 15, that is, the lowering and lifting of the support member 12 can be controlled, without needing to provide an additional spring to provide force for the lifting and lowering of the support member 12. In addition, during the lowering or lifting of the support member 12, the first push part 14 and the second push part 15 may positionally limit the support member 12 from above or below the support member 12, respectively. There is no need to provide additional components such as a fixed base, a sliding column, and a limiting plate for positional limitation, so that the movement control on the support member 12 more simple. In this way, a structure can be simplified, and the thickness dimension of the folding assembly 10 can be reduced, thereby reducing the space of the folding apparatus 100 occupied in a thickness direction by the folding assembly.

In addition, because the first push part 14 and the second push part 15 are arranged in sequence in a direction of a rotation axis e of the swing arm 13, the first push part 14 and the second push part 15 may be relatively staggered in the direction of the rotation axis e of the swing arm 13. Compared with a situation in which the first push part 14 and the second push part 15 are in a same position in the direction of the rotation axis e of the swing arm 13, which results in a superposition in the thickness dimension of the first push part 14, the second push part 15, and space or an entity between the first push part 14 and the second push part 15, the support member 12 can be provided with an upward push and a downward push respectively at different positions in the direction of the rotation axis e of the swing arm 13. In other words, in a same position in the direction of the rotation axis e of the swing arm 13, the first push part 14 and the second push part 15 can be fitted with only one surface of the support member 12. In this way, part of the burden of the thickness is transferred into the direction of the rotation axis e of the swing arm 13, so as to reduce the overall superposed dimension, in the thickness direction, of the first push part 14, the second push part 15, and the space or entity between the first push part 14 and the second push part 15. Moreover, shapes of parts that are of the support member 12 and that are respectively configured to contact and be fitted with the first push part 14 and the second push part 15 are changeable (where if the first push part 14 and the second push part 15 are at a same position in the direction of the rotation axis e of the swing arm 13, parts that are of the support member 12 and that are configured to contact and be fitted with the first push part 14 and the second push part 15 are a same part of the support member 12, and there is basically no room for shape change), so as to facilitate changes in relative heights or shapes of two different parts that are of the support member 12 and that are configured to contact and be fitted with the first push part 14 and the second push part 15, respectively, to adapt to positions of the first push part 14 and the second push part 15, thereby reducing the overall thickness dimension formed by the support member 12 fitted with the first push part 14 and the second push part 15. In this way, the thickness dimension of the folding assembly 10 can be reduced, and the space of the folding apparatus 100 occupied in a thickness direction by the folding assembly 10 is reduced, thereby facilitating design of a lightweight and thin terminal device 1000.

It should be understood that the thickness mentioned above is the thickness in the direction f in which the support member 12 moves toward or away from the base 11, that is, the thickness in the Z-axis direction.

The rotary connection between the swing arm 13 and the base 11 may be implemented in various ways. The following descriptions are provided as examples.

In an embodiment, refer to FIG. 7A and FIG. 8. The folding assembly 10 includes at least two rotation shaft 193. The swing arm 13 is provided with a shaft through hole 1305. The base 11 is provided with at least two rotation shaft holes 1102. The rotation shaft holes 1102 may be through holes or blind holes. Each rotation shaft 193 passes through one shaft through hole 1305 and at least one rotation shaft hole 1102, so that one swing arm 13 is rotatably connected to the base 11 by one rotation shaft 193. In this case, the rotation axis e of the swing arm 13 is also an axis of the rotation shaft 193.

It may be understood that the rotation shaft 193 may be fixed with respect to the rotation shaft hole 1102 and rotatably fitted in the shaft through hole 1305. The rotation shaft 193 may alternatively be rotatably fitted in the rotation shaft hole 1102 and fixed with respect to the shaft through hole 1305. The rotation shaft 193 may alternatively be rotatably fitted in the rotation shaft hole 1102 and rotatably fitted in the shaft through hole 1305.

For example, still refer to FIG. 7A and FIG. 8. The base 11 may have a shaft base 111. The rotation shaft hole 1102 is provided on the shaft base 111. There may be a plurality of shaft bases 111 fitted with a same rotation shaft 193. The plurality of shaft bases 111 are arranged in sequence in the direction of the rotation axis e. The swing arm 13 may be located between two adjacent shaft bases 111. In this way, the stability of the rotary connection between the swing arm 13 and the base 11 can be improved, and the swing arm 13 can be positionally limited in the direction of the rotation axis e. Certainly, in some other embodiments, there may alternatively be one shaft base 111 fitted with a same rotation shaft 193.

Optionally, in another embodiment, a first rotation shaft part (not shown) is protruding from an end of the swing arm 13. The first rotation shaft part is generally rod-shaped or columnar. The first rotation shaft part and the swing arm 13 are of an integrated structure. The base 11 is provided with a first shaft hole. The first rotation shaft part is inserted into the first shaft hole and rotatably fitted in the first shaft hole, to rotatably connect the swing arm 13 to the base 11. At this time, the rotation axis e of the swing arm 13 is also an axis of the first rotation shaft part.

Optionally, in another embodiment, a second rotation shaft part (not shown) is protruding from the base 11. The second rotation shaft part is generally rod-shaped or columnar. The second rotation shaft part and the base 11 are of an integrated structure. The swing arm 13 is provided with a second shaft hole, and the second rotation shaft part is inserted into the second shaft hole and rotatably fitted in the second shaft hole, to rotatably connect the swing arm 13 to the base 11. At this time, the rotation axis e of the swing arm 13 is also an axis of the second rotation shaft part.

Optionally, in another embodiment, the folding assembly 10 includes a bearing (not shown), and the swing arm 13 is connected to the base 11 by the bearing, to rotatably connect the swing arm 13 to the base 11. At this time, the rotation axis e of the swing arm 13 is also an axis of the bearing. The bearing may be of various types. For example, the bearing has a first component and a second component that are rotatably fitted with each other. The swing arm 13 is connected to the first component, and the base 11 is connected to the second component.

The following describes the manner in which the support member 12 works in conjunction with the first push part 14 and the second push part 15.

In an embodiment, refer to FIG. 11 and FIG. 12 as well as FIG. 7A and FIG. 8. The support member 12 includes a first surface 1201 and a second surface 1202 on each of two opposite sides thereof. The first surface 1201 and the second surface 1202 located on a same side of the support member 12 are respectively configured to contact and be fitted with the first push part 14 and the second push part 15 on a same side. A position of the first surface 1201 corresponds to a position of the first push part 14 on the same side, and a position of the second surface 1202 corresponds to a position of the second push part 15 on the same side. To be specific, the first surface 1201 and the second surface 1202 on the left side of the support member 12 are respectively configured to contact and be fitted with the first push part 14 and the second push part 15 on the swing arm 13 on the left side of the support member 12. The first surface 1201 and the second surface 1202 on the right side of the support member 12 are respectively configured to contact and be fitted with the first push part 14 and the second push part 15 on the swing arm 13 on the right side of the support member 12.

When the swing arm 13 is in a position between the unfolded position and the folded position, for example, as shown in FIG. 9B, the first push part 14 is located on a side of the first surface 1201 away from the base 11 (where it may also be understood that the first push part 14 is located above the first surface 1201, and the "above" here should be understood in a broad sense, rather than "directly above", and may be "above any position on the first surface 1201", such as "directly above", "above a side", or "diagonally above"). Such configuration is intended to enable the first push part 14 to abut against the first surface 1201 to press down the support member 12, so that the support member 12 can be lowered or move downward. In addition, for example, as shown in FIG. 10B, the second push part 15 is located on a side of the second surface 1202 close to the base 11 (where it may also be understood that the second push part 15 is located below the second surface 1202, and the "below" here should be understood in a broad sense, rather than "directly below", and may be "below any position on the second surface 1202", such as "directly below", "below a side", or "diagonally below"). Such configuration is intended to enable the second push part 15 to abut against the second surface 1202 to lift the support member 12, so that the support member 12 can be lifted or move upward. In other words, the first push part 14 is configured to contact and be fitted with the first surface 1201 of the support member 12 so as to push the support member 12 to be lowered, and the second push part 15 is configured to contact and be fitted with the second surface 1202 of the support member 12 so as to push the support member 12 to be lifted.

Therefore, refer to FIG. 9A, FIG. 9B, and FIG. 9C in sequence. When the swing arms 13 on the two sides of the support member 12 are rotated from the unfolded position to the folded position, the swing arms 13 drive the first push parts 14 to rotate toward the base 11, and the first push parts 14 may be rotated to contact the first surfaces 1201 and exert a downward push on the first surfaces 1201, so that the support member 12 moves toward the base 11, and in other words, is lowered. Refer to FIG. 10C, FIG. 10B, and FIG. 10A in sequence. When the swing arms 13 on the two sides of the support member 12 are rotated from the folded position to the unfolded position, the swing arms 13 drive the second push parts 15 to move away from the base 11, the second push parts 15 may be rotated to contact the second surfaces 1202 and exert an upward push on the second surfaces 1202, so that the support member 12 moves away from the base 11, and in other words, is lifted.

Further, refer to FIG. 13. FIG. 13 is a right view of the support member 12 shown in FIG. 11. In the thickness direction h of the support member 12, height H1 of the first surface 1201 is lower than or equal to height H2 of the second surface 1202.

It should be understood that height H1 of the first surface 1201 and height H2 of the second surface 1202 are heights based on a same reference plane s. The reference plane s is a horizontal plane on which a lowest surface of the support member 12 in the thickness direction h of the support member 12 is located (where the thickness direction h is perpendicular to the horizontal plane). The lowest surface of the support member 12 in the thickness direction h of the support member 12 may be a flat surface or a curved surface. When the lowest surface of the support member 12 in the thickness direction h of the support member 12 is a flat surface, a horizontal plane on which the flat surface is located is used as the reference plane s. Such case is shown in FIG. 13 as an example. When the lowest surface of the support member 12 in the thickness direction h of the support member 12 is a curved surface, a horizontal plane on which a lowest point of the curved surface is located is used as the reference plane s.

It may be understood that the first surface 1201 may be a flat surface or a curved surface. When the first surface 1201 is a flat surface, height H1 of the first surface 1201 is a vertical distance between the first surface 1201 and the reference plane s. Such case is shown in FIG. 13 as an example. When the first surface 1201 is a curved surface, height H1 of the first surface 1201 is a height of a lowest point of the first surface 1201, that is, a vertical distance between the lowest point of the first surface 1201 and the reference plane s. Similarly, the second surface 1202 may be a flat surface or a curved surface. When the second surface 1202 is a flat surface, height H2 of the second surface 1202 is a vertical distance between the second surface 1202 and the reference plane s. Such case is shown in FIG. 13 as an example. When the second surface 1202 is a curved surface, height H2 of the second surface 1202 is a height of a lowest point of the second surface 1202, that is, a vertical distance between the lowest point of the second surface 1202 and the reference plane s.

Based on such configuration, because height H1 of the first surface 1201 is lower than or equal to height H2 of the second surface 1202 in the thickness direction h of the support member 12, compared with a case in which the height of the first surface 1201 is higher than the height of the second surface 1202, the first surface 1201 can leave more space on a side away from the base 11 to accommodate the first push part 14, and the second surface 1202 can leave more space on a side close to the base 11 to accommodate the second push part 15, so that it is more conducive to reducing an overall thickness dimension of the first push part 14, the second push part 15, and the parts of the support member 12 configured to be fitted with the first push part 14 and the second push part 15, thereby reducing a thickness dimension of the folding assembly 10, and reducing the space of the folding apparatus 100 occupied in a thickness direction by the folding assembly.

Optionally, refer to FIG. 11 and FIG. 13. Height H1 of the first surface 1201 is lower than height H2 of the second surface 1202 in the thickness direction h of the support member 12. At this time, it is more conducive to reducing the thickness dimension of the folding assembly 10.

The first surface 1201 and the second surface 1202 arranged at different heights on the support member 12 may be implemented in various ways. Examples are described below.

Optionally, in an embodiment, refer to FIG. 11 to FIG. 13. The support member 12 includes a main body part 121, first protruding parts 122, and second protruding parts 123. The main body part 121 may be a structure in various shapes, such as a frame structure, a plate structure, or a block structure, but is not limited thereto. The first protruding part 122 protrudes from each of two opposite sides of the main body part 121. The first protruding part 122 generally protrudes from the main body part 121 toward the swing arm 13. A protruding direction may be generally parallel to the X-axis direction. Certainly, there may alternatively be a specific included angle between the protruding direction and the X-axis. The second protruding part 123 protrudes from each of the two opposite sides of the main body part 121. The second protruding part 123 generally protrudes from the main body part 121 toward the swing arm 13. A protrusion direction may be generally parallel to the X-axis direction. Certainly, there may alternatively be a specific included angle between the protruding direction and the X-axis. The first protruding part 122 and the second protruding part 123 may be protrusion structures of various shapes, such as block-shaped structures, columnar structures, or hook-like structures, but are not limited thereto. The first protruding part 122 includes the first surface 1201 on a side thereof away from the base 11. It may also be understood that the first surface 1201 is provided or formed on an upper surface of the first protruding part 122. The second protruding part 123 includes the second surface 1202 on the side thereof close to the base 11. It may also be understood that the second surface 1202 is provided or formed on a lower surface of the second protruding part 123. Therefore, the first protruding part 122 is lower than the second protruding part 123 in the thickness direction h of the support member 12. In other words, when the swing arm 13 is in the unfolded state, the first protruding part 122 is closer to the base 11 than the second protruding part 123 in the direction f in which the support member 12 moves toward or away from the base 11.

Based on such configuration, because both the first protruding part 122 and the second protruding part 123 protrude from the main body part 121, space communicated with the outside may be formed above the first protruding part 122 to accommodate the first push part 14, so as to prevent interference with the rotation of the first push part 14; and space communicated with the outside may be formed below the second protruding part 123 to accommodate the second push part 15, so as to prevent interference with the rotation of the second push part 15. Furthermore, by providing the first protruding part 122 and the second protruding part 123 with different heights, the first surface 1201 and the second surface 1202 at different heights may be formed.

Optionally, refer to FIG. 13. Projection of the first protruding part 122 does not overlap projection of the second protruding part 123 in the thickness direction h of the support member 12, so that the first protruding part 122 and the second protruding part 123 can be independently fitted with the first push part 14 and the second push part 15 respectively, thereby reducing a probability of interferences between the first protruding part 122 and the second push part 15 and between the second protruding part 123 and the first push part 14.

Further, a gap exists between the projection of the first protruding part 122 and the projection of the second protruding part 123 in the thickness direction h of the support member 12. In other words, the first protruding part 122 and the second protruding part 123 are spaced apart in the direction of the rotation axis e. In this way, it is more conducive for the first protruding part 122 and the second protruding part 123 to be independently fitted with the first push part 14 and the second push part 15, respectively.

Optionally, refer to FIG. 8 as well as FIG. 9A to FIG. 9C. Relief spaces 1101 are provided in the base 11. The relief space 1101 may be a space formed by a recess, a hole, or another hollow part. Positions of the relief spaces 1101 correspond to positions of the first protruding parts 122. A quantity of the relief spaces 1101 may correspond to a quantity of the first protruding parts 122. The relief space 1101 is configured to avoid the first protruding part 122 when the support member 12 moves toward the base 11. Therefore, when the swing arm 13 is in the folded position, the first protruding part 122 is at least partially located in the relief space 1101 (that is, the first protruding part 122 may be partially located in the relief space 1101, or may be entirely located in the relief space 1101), so as to prevent interference with another component when the first protruding part 122 is lowered by a specific distance, and increase a stroke of the first protruding part 122. Moreover, the structural compactness of the base 11 and the support member 12 in the direction f in which the support member 12 moves toward or away from the base 11 can be increased, and the thickness dimension of the folding assembly 10 can be reduced.

Optionally, refer to FIG. 8 as well as refer to FIG. 9A to FIG. 9C. Each of two sides of the base 11 is provided with the relief space 1101. The relief space 1101 and the first protruding part 122 may be arranged in one-to-one correspondence. The base 11 has a connection part 112 formed between two relief spaces 1101. The connection part 112 may be in various shapes, such as a strip shape, a block shape, or a rod shape, but is not limited thereto. A relief recess 120 is provided on one side of the main body part 121 close to the base 11. The relief recess 120 is configured to avoid the connection part 112 when the support member 12 moves toward the base 11. Therefore, when the swing arm 13 is in the folded position, the connection part 112 is at least partially located in the relief recess 120 (that is, the connection part 112 may be partially located in the relief recess 120, or may be completely located in the relief recess 120), so as to further increase a descending stroke of the support member 12, and further increase the structural compactness the base 11 and the support member 12 in the direction f in which the support member 12 moves toward or away from the base 11, thereby reducing the thickness dimension of the folding assembly 10.

Optionally, refer to FIG. 14 and FIG. 15. FIG. 14 is a schematic diagram of a structure of a swing arm 13 according to an embodiment of this application. FIG. 15 is a schematic diagram of a structure of the swing arm 13 shown in FIG. 14 from another angle of view. The swing arms 13 on the two sides of the support member 12 are each provided with a first recess 1301 and a second recess 1302. The first recess 1301 allows the first protruding part 122 on a same side to project into. Therefore, a position of the first recess 1301 corresponds to a position of the first protruding part 122. The second recess 1302 allows the second protruding part 123 on a same side to project into. Therefore, a position of the second recess 1302 corresponds to a position of the second protruding part 123. It may be understood that in the direction of the rotation axis e of the swing arm 13, the first recess 1301 and the second recess 1302 may be relatively staggered. Certainly, the first recess 1301 may alternatively extend in the direction of the rotation axis e toward a side on which the second recess 1302 is located, to cause projection of the first recess 1301 overlap projection of the second recess 1302 in the direction f in which the support member 12 move toward or away from the base 11.

Based on such configuration, during rotation of the swing arm 13 between the unfolded position and the folded position, the first recess 1301 allows the first protruding part 122 to project into to avoid and accommodate the first protruding part 122, and the second recess 1302 allows the second protruding part 123 to project into to avoid and accommodate the second protruding part 123, so that a distance between the support member 12 and the swing arm 13 as well as a relative height difference between the support member 12 and the swing arm 13 are reduced, thereby further reducing the thickness dimension of the folding assembly 10. Moreover, when the first protruding part 122 projects into the first recess 1301, an inner wall of the first recess 1301 may positionally limit the first protruding part 122, or when the second protruding part 123 projects into the second recess 1302, an inner wall of the second recess 1302 may positionally limit the second protruding part 123, to prevent the movement of the first protruding part 122 and the second protruding part 123 in the direction of the rotation axis e of the swing arm 13, that is, to prevent movement of the support member 12 in the direction of the rotation axis e, thereby improving the stability of the support member 12 when moving toward or away from the base 11.

For example, refer to FIG. 9A. When the swing arm 13 is in the unfolded position, the first protruding part 122 at least partially projects into the first recess 1301 (that is, the first protruding part 122 may partially project into the first recess 1301 or may completely project into the first recess 1301). During rotation of the swing arm 13 from the unfolded position to the folded position, as shown in FIG. 9A, FIG. 9B, and FIG. 9C in sequence, a part of the first protruding part 122 projecting into the first recess 1301 may gradually move outward, and as shown in FIG. 10A, FIG. 10B, and FIG. 10C in sequence, the second protruding part 123 may gradually project into the second recess 1302. Refer to FIG. 10C. When the swing arm 13 is in the folded position, the second protruding part 123 at least partially projects into the second recess 1302 (that is, the second protruding part 123 may partially project into the second recess 1302 or may completely project into the second recess 1302). During rotation of the swing arm 13 from the folded position to the unfolded position, as shown in FIG. 10C, FIG. 10B, and FIG. 10A in sequence, a part of the second protruding part 123 projecting into the second recess 1302 gradually moves outward, and as shown in FIG. 9C, FIG. 9B, and FIG. 9A in sequence, the first protruding part 122 may gradually project into the first recess 1301.

Optionally, refer to FIG. 14 and FIG. 15. The first push part 14 is provided on an inner wall and/or an outer edge of the first recess 1301. To be specific, the first push part 14 may be provided only on the inner wall of the first recess 1301, or the first push part 14 may be provided only on the outer edge of the first recess 1301, or the first push part 14 may be provided on both the inner wall and the outer edge of the first recess 1301. The second push part 15 is provided on an inner wall and/or an outer edge of the second recess 1302. To be specific, the second push part 15 may be provided only on the inner wall of the second recess 1302, or the second push part 15 may be provided only on the outer edge of the second recess 1302, or the second push part 15 may be provided on both the inner wall and the outer edge of the second recess 1302.

It may be understood that the inner wall of the first recess 1301 is an inner surface defining the first recess 1301, including inner side walls and an inner bottom wall of the first recess 1301. When the bottom of the first recess 1301 is communicated with the shaft through hole 1305, a surface of the rotation shaft 193 located at the bottom of the first recess 1301 serves as the inner bottom wall of the first recess 1301. Similarly, inner walls of the second recess 1302 are inner surfaces defining the second recess 1302, and include inner side walls and an inner bottom wall of the second recess 1302. When the bottom of the second recess 1302 is communicated with the shaft through hole 1305, a surface of the rotation shaft 193 located at the bottom of the second recess 1302 serves as the inner bottom wall of the second recess 1302. It may also be understood that the outer edge of the first recess 1301 is a peripheral edge of a recess opening of the first recess 1301. The outer edge of the second recess 1302 is a peripheral edge of a recess opening of the second recess 1302.

Based on such configuration, because the first push part 14 is provided on the inner wall and/or the outer edge of the first recess 1301, and the second push part 15 is provided on the inner wall and/or the outer edge of the second recess 1302, compared with a case in which the first push part 14 and the second push part 15 extend outward away from the swing arm 13, the first push part 14 and the second push part 15 may project outward away from the swing arm 13 by a shorter distance, or even does not need to project outward (for example, the first push part 14 is directly formed on the inner wall and/or the outer edge of the first recess 1301, and the second push part 15 is directly formed on the inner wall and/or the outer edge of the second recess 1302). In this way, a distance between the support member 12 and the swing arm 13 as well as a relative height difference between the support member 12 and the swing arm 13 can be further reduced, thereby further reducing the thickness dimension of the folding assembly 10, and improving the stability of the support member 12 in moving due to the reduction in the height difference.

For example, refer to FIG. 14 and FIG. 15. The first push part 14 is provided on an inner side wall and an outer edge of the first recess 1301. Specifically, the first push part 14 includes a first part 14*a* and a second part 14*b* that are connected to each other. The first part 14*a* is provided on the inner side wall of the first recess 1301, and the second part 14*b* extends to the outer edge of the first recess 1301. During rotation of the swing arm 13 from the unfolded position to the folded position, the first part 14*a* may first contact the first surface 1201, and then the second part 14*b* gradually contacts the first surface 1201, so as to control the support member 12 to be lowered progressively, thereby improving the stability of the support member 12 during lowering.

The first part 14*a* is an arc structure, and the second part 14*b* is a bulge structure, so that during rotation of the swing arm 13 from the unfolded position to the folded position, the first surface 1201 is abutted against by the arc structure first and then the bulge structure on the first push part 14, so as to push the support member 12 to be lowered stably.

Certainly, in some other embodiments, the first part 14*a* may alternatively be a planar structure, a bulge structure, a raised structure, a protruding structure, a rod-shaped structure, a columnar structure, or the like, but is not limited thereto. The second part 14*b* may alternatively be a planar structure, an arc structure, a raised structure, a protruding structure, a rod-shaped structure, a columnar structure, or the like, but is not limited thereto. A specific structure of the first push part 14 may be configured based on actual requirements on descending stroke and trajectory of the support member 12, and is not uniquely limited in embodiments of this application.

For example, still refer to FIG. 14 and FIG. 15. The second push part 15 is provided on an inner wall and an outer edge of the second recess 1302. Specifically, the second push part 15 includes a third part 15*a* and a fourth part 15*b* that are connected to each other. The third part 15*a* is provided on the inner side wall of the second recess 1302, and the fourth part 15*b* extends to the outer edge of the second recess 1302. During rotation of the swing arm 13 from the folded position to the unfolded position, the third part 15*a* may contact the second surface 1202 first, and then the fourth part 15*b* contacts the second surface 1202, so as to facilitate progressive control of the lifting and lowering of the support member 12, thereby improving the stability of the support member 12 during lifting and lowering.

The third part 15*a* is a bulge structure, and the fourth part 15*b* is a planar structure, so that during rotation of the swing arm 13 from the folded position to the unfolded position, the second surface 1202 is first abutted against by the bulge structure of the second push part 15, and then supported by the planar structure of the second push part 15, so as to facilitate pushing the support member 12 to be lifted stably and support the second surface 1202 when the swing arm 13 is in the unfolded position.

Certainly, in some other embodiments, the third part 15*a* may alternatively be a planar structure, an arc structure, a raised structure, a protruding structure, a rod-shaped structure, a columnar structure, or the like, but is not limited thereto. The fourth part 15*b* may alternatively be an arc structure, a bulge structure, a raised structure, a protruding structure, a rod-shaped structure, a columnar structure, or the like, but is not limited thereto. A specific structure of the second push part 15 may be configured based on actual requirements on the lifting stroke and trajectory of the support member 12, and is not uniquely limited in embodiments of this application.

It should be noted that the first push part 14 is not necessarily provided on the inner wall and/or the outer edge of the first recess 1301 and may alternatively be provided at any position on the swing arm 13 outside the first recess 1301. In this case, the first push part can also push the support member 12 to be lowered. The second push part 15 is not necessarily provided on the inner wall and/or the outer edge of the second recess 1302 and may alternatively be provided at any position on the swing arm 13 outside the second recess 1302. In this case, the second push part can also push the support member 12 to be lifted.

It should be further noted that, in some other embodiments, the first recess 1301 and the second recess 1302 may not be provided. For example, the first push part 14 and the second push part 15 are protruding structures protruding outward from the swing arm 13.

Optionally, refer to FIG. 9A and FIG. 15. The first push part 14 and the swing arm 13 are of an integrated structure, thereby improving the structure reliability of the first push part 14. In addition, when the first recess 1301 is provided on the swing arm 13, the inner wall and/or the outer edge of the first recess 1301 is directly formed into the first push part 14 that is a planar structure or a bulge structure, thereby facilitating production and manufacturing. Certainly, in some other embodiments, the first push part 14 and the swing arm 13 may alternatively be formed separately and connected to each other.

Optionally, refer to FIG. 10A and FIG. 14. The second push part 15 and the swing arm 13 are of an integrated structure, so that the structure reliability of the second push part 15 is improved. In addition, when the second recess 1302 is provided on the swing arm 13, the inner wall and/or the outer edge of the second recess 1302 is directly formed into the second push part 15 that is a planar structure or a bulge structure, thereby facilitating production and manufacturing. Certainly, in some other embodiments, the second push part 15 and the swing arm 13 may alternatively be formed separately and connected to each other.

The foregoing embodiment describes the case in which the support member 12 is provided with the first surface 1201 and the second surface 1202 with different heights by providing the first protruding part 122 and the second protruding part 123. However, in some other embodiments, the first protruding part 122 and the second protruding part 123 may alternatively not be provided.

Optionally, in another embodiment, refer to FIG. 16 and FIG. 17. FIG. 16 is a schematic diagram of a structure of a support member 12 according to another embodiment of this application. FIG. 17 is a schematic cross-sectional view showing how the support member 12 shown in FIG. 16 works in conjunction with the first push part 14 and the second push part 15. The support member 12 includes a first recessed part 125 and a second recessed part 126 on each of the two opposite sides thereof. To be specific, the support member 12 include a first recessed part 125 and a second recessed part 126 on each of two sides thereof facing the swing arms 13. The first recessed part 125 is located on a side of the support member 12 away from the base 11, and the first recessed part 125 passes through the top and side of the support member 12 to allow the first push part 14 to project into. An inner bottom wall of the first recessed part 125 includes a first surface 1201. The second recessed part 126 is located on a side of the support member 12 close to the base 11, and the second recessed part 126 passes through the bottom and side of the support member 12 to allow the second push part 15 to project into. The inner bottom wall of the second recessed part 126 includes a second surface 1202. In a thickness direction h of the support member 12, height H1 of the first surface 1201 is lower than or equal to height H2 of the second surface 1202. In this case, both the first push part 14 and the second push part 15 are protruding structures protruding outward from the swing arm 13, and may be protruding structures of a regular shape or an irregular shape, such as rod-shaped structures, columnar structures, strip-shaped structures, or hook-like structures, but are not limited thereto.

It may be understood that the first recessed part 125 and the second recessed part 126 may be recesses provided in the support member 12 (such case is shown in FIG. 16 as an example), or may be recesses formed by bending the support member 12. This is not uniquely limited in embodiments of this application.

Based on such configuration, during rotation of the swing arm 13 between the unfolded position and the folded position, the first recessed part 125 allows the first push part 14 to project into to avoid and accommodate the first push part 14, and the second recessed part 126 allows the second push part 15 to project into to avoid and accommodate the second push part. In addition, the first surface 1201 is provided on the inner bottom wall of the first recessed part 125 and does not need to extend to the outside; and the second surface 1202 is provided on the second recessed part 126 and does not need to extend to the outside. Therefore, a distance between the support member 12 and the swing arm 13 can be reduced, and a relative height difference between the support member 12 and the swing arm 13 is reduced, thereby further reducing the thickness dimension of folding assembly 10.

Moreover, at least a part of the support member 12 located between the first recessed part 125 and the second recessed part 126 can be positionally limited between the first push part 14 and the second push part 15. Alternatively, when the first recessed part 125 has two opposite inner side walls, the two opposite inner side walls of the first recessed part 125 can positionally limit the first push part 14. Alternatively, when the second recessed part 126 has two opposite inner side walls, the two opposite inner side walls of the second recessed part 126 can positionally limit the second push part 15. Therefore, the movement of the support member 12 in the direction of the rotation axis e can be prevented, thereby improving the stability of the support member 12 when moving toward or away from the base 11. In addition, by adjusting depths of the first recessed part 125 and the second recessed part 126 respectively, a height difference between the first surface 1201 and the second surface 1202 may be changed.

Optionally, refer to FIG. 18. FIG. 18 is a schematic diagram of a structure of a support member 12 according to another embodiment of this application. The two first recessed parts 125 on two opposite sides of the support member 12 may be communicated with each other. In this case, the two first recessed parts 125 may be collectively regarded as a through-recess with both ends communicated with the outside. Similarly, two second recessed parts 126 on the two opposite sides of the support member 12 may also be communicated with each other. In this case, the two second recessed parts 126 may be collectively regarded as a through-recess with both ends communicated with the outside.

The foregoing embodiment describes the case in which the support member 12 is provided with the first recessed part 125 and the second recessed part 126, to form the first surface 1201 and the second surface 1202 with different heights. However, the support member 12 is not necessarily provided with only the first recessed part 125 and the second recessed part 126 or provided with only the first protruding part 122 and the second protruding part 123, to form the first surface 1201 and the second surface 1202 with different heights.

Optionally, in another embodiment, refer to FIG. 19. FIG. 19 is a schematic diagram of a structure of a support member 12 according to another embodiment of this application. The support member 12 includes a first protruding part 122 and a second recessed part 126 on each of two opposite sides thereof. The first protruding part 122 includes a first surface 1201 on a side thereof away from the base 11. The second recessed part 126 includes a second surface 1202 on an inner bottom wall thereof, and a height of the first surface 1201 may be lower than or equal to a height of the second surface 1202. In this case, the swing arm 13 may or may not have the first recess 1301 allowing the first protruding part 122 to project into, and the first push part 14 may have the shape and structure described in the foregoing embodiments. Details are not described herein again. The second push part

15 is a protruding structure protruding outward from the swing arm 13 to project into the second recessed part 126.

Optionally, in another embodiment, refer to FIG. 20. FIG. 20 is a schematic diagram of a structure of a support member 12 according to another embodiment of this application. The support member 12 includes a first recessed part 125 and a second protruding part 123 on each of two opposite sides thereof. The first recessed part 125 includes a first surface 1201 on an inner bottom wall thereof. The second protruding part 123 includes a second surface 1202 on a side thereof close to the base 11, and a height of the first surface 1201 may be lower than or equal to a height of the second surface 1202. In this case, the first push part 14 is a protruding structure protruding outward from the swing arm 13 to project into the first recessed part 125. The swing arm 13 may or may not have the second recess 1302 allowing the second protruding part 123 to project into, and the second push part 15 may have the shape and structure described in the foregoing embodiments. Details are not described herein again.

It may be understood that structures for forming the first surfaces 1201 on the two opposite sides of the support member 12 may be the same or different. For example, when the structures for forming the first surfaces 1201 on the two opposite sides of the support member 12 are different, the support member 12 may include the first recessed part 125 on one side thereof and the first recessed part 125 may include the first surface 1201 on the inner bottom wall thereof. The support member 12 includes the first protruding part 122 on the other side thereof, and the first protruding part 122 includes the first surface 1201 on a side thereof away from the base 11. Similarly, the structures for forming the second surfaces 1202 on the two opposite sides of the support member 12 may be the same or different.

It should be noted that, the foregoing embodiments describe the case in which a height of the first surface 1201 is lower than or equal to a height of the second surface 1202 in a thickness direction h of the support member 12. However, in some other embodiments, a height of the first surface 1201 is lower than or equal to a height of the second surface 1202 in a thickness direction h of the support member 12. For example, at least one of the first push part 14 and the second push part 15 may be an elastic structure capable of elastic deformation. Therefore, when the first push part 14 and the second push part 15 push the support member 12, even if the overall thickness dimension formed by the first push part 14, the second push part 15, and the support member 12 together is small, elastic deformation of the elastic structure may be caused to prevent stuck of the first push part 14 and the second push part 15 due to excessively small gaps between the first push part 14 and the support member 12 and between the second push part 15 and the support member 12. In this way, the support member 12 can be pushed to be lowered and lifted while the thickness dimension of the folding assembly 10 can be reduced appropriately.

The following describes the fitting between the first push part 14 and the support member 12 in detail.

In an embodiment, refer to FIG. 15. The first push part 14 has a first cam surface 141. Refer to FIG. 9A, FIG. 9B, and FIG. 9C in sequence. During rotation of the swing arm 13 from the unfolded position to the folded position, the first cam surface 141 forms a cam-follower mate with the first surface 1201. It may be understood that the first cam surface 141 is an edge surface of a cam structure, may be a curved surface of various shapes, and may be specifically configured based on a descending stroke or a displacement amount of the support member 12.

Based on such configuration, during rotation of the swing arm 13 from the unfolded position to the folded position, the swing arm 13 drives the first push part 14 and the second push part 15 to rotate toward the base 11. When the first push part 14 is rotated to contact the first surface 1201, the first cam surface 141 of the first push part may form a cam-follower mate with the first surface 1201 to exert a downward push or pressure on the support member 12, so that the support member 12 is gradually lowered, and a side of the second push part 15 on the second surface 1202 close to the base 11 provides support for the support member 12, thereby facilitating stable lowering of the support member 12. When the first cam surface 141 pushes the support member 12 to be lowered, the first cam surface 141 slides with respect to the first surface 1201. The cam-follower mate can improve the fitting stability and relative sliding smoothness between the first push part 14 and the support member 12 and facilitates control of a descending stroke or a displacement amount of the support member 12 by changing the shape of the first cam surface 141.

For example, refer to FIG. 15 and FIG. 9B. When the swing arm 13 is provided with the first recess 1301, the first cam surface 141 may be provided on the inner wall and/or the outer edge of the first recess 1301. Optionally, the first part 14*a* of the first push part 14 has a first cam surface 141. Certainly, the second part 14*b* may also have a first cam surface 141. Optionally, the first cam surface 141 is in an outward-protruding bulge shape or an arc shape, to facilitate pushing the support member 12 to be lowered.

It should be understood that an example in which the swing arm 13 is provided with the first recess 1301 is used in the foregoing description. The first cam surface 141 is also applicable to various other cases in which the swing arm 13 is not provided with the first recess 1301, and the first cam surface 141 is provided on the first push part 14.

It should be noted that the first push part 14 is not necessarily provided with the first cam surface 141 to push the support member 12 to be lowered. In some other embodiments, the first push part 14 may be a structure in other various shapes, such as a cylindrical structure, a polyhedral structure, a chamfered structure, or an edge structure, but is not limited thereto, to push the support member 12 to be lowered.

Optionally, in an embodiment, refer to FIG. 9C. When the swing arm 13 is in the folded position, the first push part 14 is in contact with the first surface 1201, so that the support member 12 may be prevent from lifting under external force, thereby improving the stability of the support member 12. Meanwhile, refer to FIG. 10C. When the swing arm 13 is in the folded position, there is a gap d1 between the second push part 15 and the second surface 1202. To be specific, there is a gap d1 between a surface of the second push part 15 (such as the second cam surface 151 described below) and the second surface 1202. In other words, the second push part 15 is not in contact with the second surface 1202 (at this time, the support member 12 may be supported on the base 11, or another support structure is provided to support the support member 12). In this case, the projection of the second push part 15 may or may not overlap the projection of the support member 12 in the direction f in which the support member 12 moves toward or away from the base 11. Therefore, during rotation of the swing arm 13 between the unfolded position and the folded position, the support member 12 is not in close contact with the first push part 14 and the second push part 15, but there is specific space for movement for the cooperation between the support member 12 and the first push part 14 and the second push part 15, so that the first push part 14 and the second push part 15 can push the support member 12 to be lowered and lifted respectively more smoothly.

Optionally, refer to FIG. 14 and FIG. 15, the first push part 14 has a first contact surface 142. Refer to FIG. 9C. When the swing arm 13 is in the folded position, the first contact surface 142 is in surface contact with the first surface 1201, such that, compared with line contact or point contact, the stability of contact and fitting between the first push part 14 and the first surface 1201 may be improved.

It may be understood that the first contact surface 142 may be a flat surface or a curved surface. When the first contact surface 142 is a flat surface, the first surface 1201 also has a corresponding surface to be in surface contact with the first contact surface 142 (such case is shown in FIG. 9C and FIG. 15 as an example). When the first contact surface 142 is a curved surface, the first surface 1201 also has a corresponding surface to be in surface contact with the first contact surface 142.

For example, refer to FIG. 14 and FIG. 15. When the swing arm 13 is provided with the first recess 1301, the first contact surface 142 may be provided on the inner wall and/or the outer edge of the first recess 1301. Optionally, the second part 14*b* of the first push part 14 has a first contact surface 142. Certainly, the first contact surface 142 may alternatively extend to the first part 14*a*. For example, the first contact surface 142 is a curved surface and is in surface contact with a corresponding curved surface provided on the support member 12.

Refer to FIG. 9A, FIG. 9B, and FIG. 9C in sequence. During rotation of the swing arm 13 from the unfolded position to the folded position, the first cam surface 141 of the first push part 14 first forms a cam-follower mate with the first surface 1201, and then the first contact surface 142 of the first push part 14 is in contact with the first surface 1201.

It may be understood that an example in which the swing arm 13 is provided with the first recess 1301 is used in the foregoing description. The first contact surface 142 is also applicable to various other cases in which the swing arm 13 is not provided with the first recess 1301, and the first contact surface 142 is provided on the first push part 14.

Certainly, in some other embodiments, when the swing arm 13 is in the folded position, the first push part 14 and the first surface 1201 may alternatively be in line contact or point contact.

It should be noted that, in some other embodiments, when the swing arm 13 is in the folded position, the first push part 14 and the first surface 1201 may alternatively be spaced apart instead of in contact with each other (for example, a gap exists between the first push part 14 and the first surface 1201, which are still located on a side of the first surface 1201 away from the base 11, so that a position of the support member 12 may be positionally limited to prevent the lifting of the support member 12), and the second push part 15 and the second surface 1202 may be in contact with each other, to the support the support member 12. In some other embodiments, when the swing arm 13 is in the folded position, while the first push part 14 is in contact with the first surface 1201, the second push part 15 may also be in contact with the second surface 1202.

Optionally, in an embodiment, refer to FIG. 9C and FIG. 10C. When the swing arm 13 is in the folded position, the support member 12 is supported on the base 11. In this way, not only can the stability of the support member 12 be improved, but the support member 12 can be lowered to a lowest position, so as to provide more space on a side of the support member 12 away from the base 11 to accommodate the bent foldable part 210. In this case, the second push part 15 and the second surface 1202 may or may not be in contact.

For example, refer to FIG. 9A to FIG. 9C. When the relief recess 120 is provided at a side of the main body part 121 of the support member 12 close to the base 11, and when the swing arm 13 is in the folded position, the inner bottom wall of the relief recess 120 is supported on the connection part 112 of the base 11, to reduce the thickness of the main body part 121 so as to enable the support member 12 to have a greater downward displacement amount.

Certainly, in some other embodiments, the relief recess 120 may not be provided. For example, the lower end of the first protruding part 122 or the support member 12 is supported on the base 11.

It should be noted that, in some other embodiments, when the swing arm 13 is in the folded position, the second push part 15 may be in contact with the second surface 1202, and the support member 12 may be supported on the second push part 15. At this time, the support member 12 does not need to be supported on the base 11.

The following describes the fitting between the second push part 15 and the support member 12 in detail.

In an embodiment, refer to FIG. 14. The second push part 15 has a second cam surface 151. Refer to FIG. 10A to FIG. 10B. When the swing arm 13 is rotated between the unfolded position and the folded position, the second cam surface 151 forms a cam-follower mate with the second surface 1202. It may be understood that the second cam surface 151 is an edge surface of a cam structure, may be a curved surface of various shapes, and may be specifically configured based on a stroke or a displacement amount of the support member 12.

Based on such configuration, during rotation of the swing arm 13 from the folded position to the unfolded position, the swing arm 13 drives the first push part 14 and the second push part 15 to rotate away from the base 11. When the second push part 15 is rotated to contact the second surface 1202, the second cam surface 151 of the second push part may form a cam-follower mate with the second surface 1202 exert an upward push on the support member 12, so that the support member 12 is gradually lifted, and a side of the first push part 14 on the support member 12 away from the base 11 provides positional limitation for the support member 12 (where the first push part 14 and the support member 12 may or may not contact), to assist in controlling a stroke and a trajectory of the support member 12, thereby facilitating stable lifting of the support member 12. When the second cam surface 151 pushes the support member 12 to be lifted, the second cam surface 151 slides with respect to the second surface 1202. The cam-follower mate can improve the fitting stability and relative sliding smoothness between the second push part 15 and the support member 12, and enables a stroke or a displacement amount of the support member 12 to be controllable by changing the shape of the second cam surface 151.

Refer to FIG. 9A to FIG. 10C. During rotation of the swing arm 13 from the unfolded position to the folded position, the swing arm 13 drives the first push part 14 and the second push part 15 to rotate toward the base 11, and the first push part 14 pushes the support member 12 to be lowered. During the rotation of the second push part 15, the second cam surface 151 and the second surface 1202 can form a cam-follower mate to support the support member 12, so that the second push part 15 and the first push part 14 work in conjunction with each other to facilitate stable lowering of the support member 12.

For example, refer to FIG. 14 and FIG. 10B. When the swing arm 13 is provided with the second recess 1302, the second cam surface 151 may be provided on the inner wall and/or the outer edge of the second recess 1302. Optionally, the third part 15*a* of the second push part 15 has a second cam surface 151. Certainly, the fourth part 15*b* may also have a second cam surface 151. Optionally, the second cam surface 151 is in an outward-protruding bulge shape or an arc shape, to facilitate pushing the support member 12 to be lifted or supporting the support member 12 to be lowered.

It should be understood that an example in which the swing arm 13 is provided with the second recess 1302 is used in the foregoing description. The second cam surface 151 is also applicable to various other cases in which the swing arm 13 is not provided with the second recess 1302, and the second cam surface 151 is provided on the second push part 15.

It should be noted that the second push part 15 is not necessarily provided with the second cam surface 151 to form a cam-follower mate with the second surface 1202. In some other embodiments, the second push part 15 may be a structure in other various shapes to push the support member 12 to be lifted or support the support member 12 to be lowered. For example, the second push part may be a cylindrical structure, a polyhedral structure, a chamfered structure, an edge structure, or the like, but is not limited thereto.

Optionally, in an embodiment, refer to FIG. 10A and FIG. 9A. When the swing arm 13 is in the unfolded position, the second push part 15 is in contact with the second surface 1202 to support the support member 12. A gap d2 exists between the first push part 14 and the first surface 1201. To be specific, a gap d2 exists between a surface of the first push part 14 (such as the first cam surface 141 mentioned above) and the first surface 1201. To be specific, the first push part 14 is not in contact with the first surface 1201, but the first push part 14 can be located on a side of the first surface 1201 away from the base 11 to prevent upward movement of the support member 12 under external force. Therefore, during rotation of the swing arm 13 between the unfolded position and the folded position, the support member 12 is not in close contact with the first push part 14 and the second push part 15, but there is specific space for movement for the cooperation between the support member 12 and the first push part 14 and the second push part 15, so that the first push part 14 and the second push part 15 can push the support member 12 to be lowered and lifted respectively more smoothly.

Optionally, refer to FIG. 14. The second push part 15 has a second contact surface 152. Refer to FIG. 10A. When the swing arm 13 is in the unfolded position, the second contact surface 152 is in surface contact with the second surface 1202, so that, compared with the line contact or the point contact, the stability of the contact and fitting between the second push part 15 and the second surface 1202 can be improved.

It may be understood that the second contact surface 152 may be a flat surface or a curved surface. When the second contact surface 152 is a flat surface, the second surface 1202 also has a corresponding surface to be in surface contact with the second contact surface 152 (such case is shown in FIG. 10A and FIG. 14 as an example). When the second contact surface 152 is a curved surface, the second surface 1202 also has a corresponding surface to be in surface contact with the second contact surface 152.

For example, refer to FIG. 14 and FIG. 10A. When the swing arm 13 is provided with the second recess 1302, the second contact surface 152 may be provided on the inner wall and/or the outer edge of the second recess 1302. Optionally, the fourth part 15*a* of the second push part 15 has a second contact surface 152. Certainly, the second contact surface 152 may alternatively extend to the third part 15*a*. For example, the second contact surface 152 is a curved surface and is in surface contact with a corresponding curved surface provided on the support member 12.

Refer to FIG. 10A, FIG. 10B, and FIG. 10C in sequence. During rotation of the swing arm 13 from the unfolded position to the folded position, the second contact surface 152 of the second push part 15 is first in contact with the second surface 1202, and then the second cam surface 151 of the second push part 15 is in contact with the second surface 1202.

It may be understood that an example in which the swing arm 13 is provided with the second recess 1302 is used in the foregoing description. The second contact surface 152 is also applicable to various other situations in which the swing arm 13 is not provided with the second recess 1302, and the second contact surface 152 is provided on the second push part 15.

Certainly, in some other embodiments, when the swing arm 13 is in the unfolded position, the second push part 15 and the second surface 1202 may alternatively be in line contact or point contact.

It should be noted that, in some other embodiments, when the swing arm 13 is in the unfolded position, the first push part 14 may also be in contact with the first surface 1201.

To improve the stability or smoothness of the support member 12 when the swing arm 13 is in the unfolded position, in an embodiment, as shown in FIG. 8 and FIG. 14, the swing arm 13 is provided with a first support part 16. The first support part 16, the first push part 14, and the second push part 15 are arranged in sequence in the direction of the rotation axis of the swing arm 13. The first push part 14 is located between the first support part 16 and the second push part 15.

Refer to FIG. 21A to FIG. 21C. FIG. 21A is a schematic cross-sectional view showing how the first support part 16 works in conjunction with the support member 12 when the swing arm 13 is in the unfolded position. FIG. 21B is a schematic cross-sectional view showing how the first support part 16 works in conjunction with the support member 12 when the swing arm 13 is located between the unfolded position and the folded position. FIG. 21C is a schematic cross-sectional view showing how the first support part 16 works in conjunction with the support member when the swing arm 13 is in the folded position.

Refer to FIG. 21A. When the swing arm 13 is in the unfolded position, the first support part 16 is located on a side of the support member 12 close to base 11 to support the support member 12. Therefore, when the swing arm 13 is in the unfolded position, the second push part 15 and the first support part 16 support the support member 12 on the side of the support member 12 close to the base 11. In addition, the first push part 14 is located between the second push part 15 and the first support part 16 and positionally limits the support member 12 on a side of the support member 12 away from the base 11, so that positional limitation for the support member 12 may be provided by three parts, where two parts are located below the support member 12, and one part is located above the support member 12. In this way, a stable positional limitation structure can be formed, thereby effectively reducing a probability of the support member 12 being deflected or pried.

It may be understood that the first support part 16 may be a structure in various shapes that can support an object to move. For example, the first support part 16 may be a protruding structure or a planar structure on the swing arm 13, or may be a rod-shaped structure, a block-shaped structure, a columnar structure, or a hook-like structure, but is not limited thereto. In addition, the first support part 16 may be a rigid structure or an elastic structure capable of elastic deformation. Optionally, the first support part 16 may be a structure the same as or similar to the second push part 15. Certainly, the first support part may alternatively be a structure different from the second push part 15.

The following describes the fitting between the first support part 16 and the support member 12 in detail.

In an embodiment, refer to FIG. 14. The first support part 16 has a third contact surface 161. Refer to FIG. 21A. When the swing arm 13 is in the unfolded position, the third contact surface 161 is in surface contact with the support member 12, so that, compared with the line contact or the point contact, the stability of the contact and fitting between the first support part 16 and the support member 12 can be improved.

It may be understood that the third contact surface 161 may be a flat surface or a curved surface. When the third contact surface 161 is a flat surface, the support member 12 also has a corresponding surface to be in surface contact with the third contact surface 161 (such case is shown in FIG. 14 and FIG. 21A as an example). When the third contact surface 161 is a curved surface, the support member 12 also has a corresponding surface to be in surface contact with the third contact surface 161.

Certainly, in some other embodiments, when the swing arm 13 is in the unfolded position, the first support part 16 and the support member 12 may alternatively be in line contact or point contact.

Optionally, in an embodiment, refer to FIG. 21A to FIG. 21C. During rotation of the swing arm 13 between the unfolded position and the folded position (that is, when the swing arm 13 is rotated to a position between the unfolded position and the folded position), the first support part 16 is not in contact with the support member 12, that is, a gap exists between the first support part 16 and the support member 12. In this way, compared with the case in which the first support part 16 is in contact with the support member 12 during rotation of the swing arm 13 between the unfolded position and the folded position, the probability of friction between the first support part 16 and the support member 12 can be reduced. To be specific, the resistance during the lowering and lifting process of the support member 12 can be reduced, thereby improving smoothness during the lowering and lifting of the support member 12 controlled by rotation of the swing arm 13.

Optionally, refer to FIG. 14. The first support part 16 has an inclined surface 162, the inclined surface 162 is located on a side of a part of the first support part 16 supporting the support member 12. When the first support part 16 has the third contact surface 161, the inclined surface 162 is located on a side of the third contact surface 161. Refer to FIG. 21A. When the swing arm 13 is in the unfolded position, the inclined surface 162 is not in contact with the support member 12 and is inclined away from the support member 12 and toward the base 11 from the support member 12. Therefore, a direction in which the inclined surface 162 faces can form a cut-out space, to avoid the support member 12 without contacting the support member 12 during rotation of the swing arm 13 from the unfolded position to the folded position.

It should be understood that the inclined surface 162 may be substantially a flat surface, or may be a curved surface that is inclined overall with a specific curvature.

It should be noted that, to prevent the first support part 16 from contacting the support member 12 during rotation of the swing arm 13 between the unfolded position and the folded position, various solutions may alternatively be used other than the foregoing solution of providing the inclined surface 162. For example, a shape and a structure of the second push part 15 and a shape and a structure of a part of the support member 12 configured to contact and be fitted with the second push part 15 may be changed. Alternatively, a shape and a structure of the first support part 16 and a shape and a structure of a part of the support member 12 configured to contact and be fitted with the first support part 16 may be changed, so that the support member 12 is supported on the second push part 15 but not on the first support part 16 during the lowering process.

For example, refer to FIG. 14. The second cam surface 151 of the second push part 15 may be in a bulge shape or in a outward-protruding shape. Meanwhile, refer to FIG. 10A to FIG. 10C, and compare FIG. 21A to FIG. 21C in sequence. During rotation of the swing arm 13 from the unfolded position to the folded position, the second cam surface 151 in a bulge shape or a outward-protruding shape forms a cam-follower mate with the second surface 1202. When the swing arms 13 rotate at a same speed, compared with the case in which the flat surface is fitted with the second surface 1202, a lowering speed of the support member 12 may be appropriately reduced, so that the first support part 16 is lowered before the support member 12 and is separated from the support member 12.

It may be understood that as shown in FIG. 22, FIG. 22 is a schematic diagram of a relationship between two points rotating by a same angle based on a same axis. When point k1 and point k2, which rotate based on a same axis o, rotate by a same angle about the axis o, a vertical distance L1 by which point k1 further away from the axis o moves downward or upward is greater than a vertical distance L2 by which point k2 closer to the axis o moves downward or upward. In other words, the vertical distance L1 by which point k1 having a greater rotation radius moves downward or upward is greater than the vertical distance L2 by which point k2 having a smaller rotation radius moves downward or upward.

In view of this, by configuring a distance (that is, the rotation radius) between a part of the first support part 16 configured to contact the support member 12 and the rotation axis e to be greater than a distance (that is, the rotation radius) between a part of the second push part 15 configured to contact the support member 12 and the rotation axis direction e, during rotation of the swing arm 13 from the unfolded position to the folded position, the first support part 16 can be separated from the support member 12 earlier than the second push part 15 to enable the support member 12 to be supported on the second push part 15; and during rotation of the swing arm 13 from the folded position to the unfolded position, the second push part 15 is in contact with the support member 12 earlier than the first support part 16 to pushes the support member 12. In this way, the first support part 16 is not in contact with the support member 12 during rotation of the swing arm 13 between the unfolded position and the folded position. The foregoing solution of designing the shape and the structure of the second push part 15 and the first support part 16 is also based on this principle. For example, during rotation of the swing arm 13 from the unfolded position to the folded position, a distance between a part where the second cam surface 151 in a bulge shape or a outward-protruding shape contacts the support member 12 and the rotation axis e gradually decreases, so that the support member 12 is always supported.

Optionally, in an embodiment, refer to FIG. 11 and FIG. 12. Meanwhile, refer to FIG. 7A and FIG. 8. The support member 12 includes a first surface 1201, a second surface 1202, and a third surface 1203 on each of the two opposite sides thereof. The first surface 1201, the second surface 1202, and the third surface 1203 located on a same side of the support member 12 are respectively configured to contact and be fitted with the first push part 14, the second push part 15, and the first support part 16 on a same side. When the swing arm 13 is in a position between the unfolded position and the folded position, as shown in FIG. 9B, the first push part 14 is located on the side of the first surface 1201 away from the base 11; as shown in FIG. 10B, the second push part 15 is located on the side of the second surface 1202 close to the base 11; and as shown in FIG. 21B, the first support part 16 is located on the side of the third surface 1203 close to the base 11. Therefore, refer to FIG. 21A. When the swing arm 13 is in the unfolded position, the first support part 16 is located on the side of the third surface 1203 close to the base 11 and supports the third surface 1203.

When the first support part 16 has the third contact surface 161, the third contact surface 161 is in surface contact with the third surface 1203. During rotation of the swing arm 13 between the unfolded position and the folded position, the first support part 16 may not be in contact with the third surface 1203, to reduce the resistance during the lifting/lowering of the support member 12.

Further, refer to FIG. 13. In a thickness direction h of the support member 12, height H1 of the first surface 1201 is lower than or equal to height H2 of the second surface 1202, and height H1 of the first surface 1201 is lower than or equal to height H3 of the third surface 1203.

It should be understood that height H1 of the first surface 1201, height H2 of the second surface 1202, and height H3 of the third surface 1203 are heights based on the same reference plane s.

It may be understood that the third surface 1203 may also be a flat surface or a curved surface. When the third surface 1203 is a flat surface, height H3 of the third surface 1203 is a vertical distance between the third surface 1203 and the reference plane s. When the third surface 1203 is a curved surface, height H3 of the third surface 1203 is a height of a lowest point of the third surface 1203, that is, a vertical distance between the lowest point of the third surface 1203 and the reference plane s.

Based on such configuration, the technical effect of height H1 of the first surface 1201 being lower than or equal to height H2 of the second surface 1202 is already described in detail in the foregoing embodiments. Details are not described herein again. However, for height H1 of the first surface 1201 to be lower than or equal to height H3 of the third surface 1203 also has the same technical effect, so that the third surface 1203 can leave more space on the side close to the base 11 to accommodate the first support part 16, so as to further reduce the overall thickness dimensions formed by the first push part 14, the second push part 15, the first support part 16, and the support member 12, and reduce the thickness dimension of the folding assembly 10, thereby reducing the space of the folding apparatus 100 occupied in a thickness direction by the folding assembly.

Optionally, refer to FIG. 13. In the thickness direction h of the support member 12, height H1 of the first surface 1201 is lower than or equal to height H3 of the third surface 1203. In this case, the thickness dimension of the folding assembly 10 can be reduced.

Optionally, refer to FIG. 13. In a thickness direction h of the support member 12, height H3 of the third surface 1203 is lower than height H2 of the second surface 1202. In this way, when the swing arm 13 is in the unfolded position, the second surface 1202 and the third surface 1203 at different heights are supported by the second push part 15 and the first support part 16 respectively, so that the stability of the support member 12 can be further improved. In addition, while the distance between the part of the first support part 16 configured to contact the third surface 1203 and the rotation axis e is greater than the distance between the part of the second push part 15 configured to contact the second surface 1202 and the rotation axis e, compared with the case in which height H3 of the third surface 1203 is higher than height H2 of the second surface 1202, the part of the first support part 16 configured to contact the third surface 1203 does not need to be spaced apart from the rotation axis e by an excessively large distance and does not need to extend outward or protrude outward by an excessively long distance.

Certainly, in some other embodiments, in the thickness direction h of the support member 12, height H3 of the third surface 1203 may alternatively be equal to or higher than height H2 of the second surface 1202.

Optionally, refer to FIG. 11 to FIG. 13. The support member 12 includes a main body part 121, first protruding parts 122, second protruding parts 123, and third protruding parts 124. The third protruding part 124 protrudes from each of the two opposite sides of the main body part 121. The third protruding part 124 generally protrudes from the main body part 121 toward the swing arm 13. A protrusion direction may be generally parallel to the X-axis direction. Certainly, there may alternatively be a specific included angle with the X-axis. The third protruding part 124 may be a protrusion structure in various shapes, such as a block-shaped structure, a columnar structure, or a hook-like structure, but is not limited thereto. The third protruding part 124 includes the third surface 1203 on a side thereof close to the base 11.

Based on such configuration, the technical effect of the first protruding part 122 and the second protruding part 123 is already described in detail in the foregoing embodiments. Details are not described herein again. The provision of the third protruding part 124 also has the same technical effect. Space communicated with the outside may be formed below the third protruding part 124 to accommodate the first support part 16, so as to prevent interference with the rotation of the first support part 16. Furthermore, by providing the first protruding part 122, the second protruding part 123, and the third protruding part 124 with different heights, the first surface 1201, the second surface 1202, and the third surface 1203 at different heights may be formed.

Optionally, refer to FIG. 13. In the thickness direction h of the support member 12, projection of the first protruding part 122, projection of the second protruding part 123, and projection of the third protruding part 124 do not overlap with each other. In other words, the projection of any two of the first protruding part 122, the second protruding part 123, and the third protruding part 124 do not overlap, so that the first protruding part 122, the second protruding part 123, and the third protruding part 124 can be independently fitted with the first push part 14, the second push part 15, and the first support part 16 respectively, to reduce a probability of interferences with each other.

Optionally, refer to FIG. 14 and FIG. 15. The swing arm 13 is provided with a first recess 1301, a second recess 1302, and a third recess 1303. The first recess 1301 allows the first protruding part 122 to project into. The second recess 1302 allows the second protruding part 123 to project into. The third recess 1303 allows the third protruding part 124 to project into to avoid and accommodate the third protruding part 124. In this way, the distance between the support member 12 and the swing arm 13 can be reduced, so that a relative height difference between the support member 12 and the swing arm 13 is reduced, and the thickness dimension of the folding assembly 10 is further reduced. In addition, an inner wall of the third recess 1303 may also positionally limit the position of the third protruding part 124 to prevent movement of the support member 12 in the direction of the rotation axis e, thereby improving the stability of the support member 12 when moving toward or away from the base 11.

For example, when the swing arm 13 is in the folded position, the third protruding part 124 at least partially projects into the third recess 1303 (that is, the third protruding part 124 may partially project into the third recess 1303 or may completely project into the third recess 1303). Refer to FIG. 21A, FIG. 21B, and FIG. 21C in sequence. During rotation of the swing arm 13 from the unfolded position to the folded position, the third protruding part 124 may project into the third recess 1303 gradually. Refer to FIG. 21C, FIG. 21B, and FIG. 21A in sequence. During rotation of the swing arm 13 from the folded position to the unfolded position, a part of the third protruding part 124 projecting into the third recess 1303 may gradually move outward.

Optionally, refer to FIG. 14 and FIG. 15. The first push part 14 is provided on an inner wall and/or an outer edge of the first recess 1301. The second push part 15 is provided on an inner side wall and/or an outer edge of the second recess 1302. The first support part 16 may be provided on an inner wall and/or an outer edge of the third recess 1303. To be specific, the first support part 16 may be provided only on the inner wall of the third recess 1303, the first support part 16 may be provided only on the outer edge of the third recess 1303, or the first support part 16 may be provided on both the inner wall and the outer edge of the third recess 1303.

It may be understood that the inner wall of the third recess 1303 is an inner surface defining the third recess 1303, including an inner side wall or an inner bottom wall of the third recess 1303. When the bottom of the third recess 1303 is communicated with the shaft through hole 1305, a surface of the rotation shaft 193 located at the bottom of the third recess 1303 serves as the inner bottom wall of the third recess 1303. The outer edge of the third recess 1303 is a peripheral edge of a recess opening of the third recess 1303.

Based on such configuration, the technical effects of the first push part 14 being provided on an inner wall and/or an outer edge of the first recess 1301 and the second push part 15 being provided on an inner wall and/or an outer edge of the second recess 1302 are already described in detail in the foregoing embodiments. Details are not described herein again. Moreover, for the first support part 16 to be provided on the inner wall and/or the outer edge of the third recess 1303 also has the same technical effect. In this way, the first support part 16 may protrude outward away from the swing arm 13 by a shorter distance, or even does not need to protrude outward (for example, the first support part 16 is directly formed on the inner wall and/or the outer edge of the third recess 1303), so that a distance between the support member 12 and the swing arm 13 as well as a relative height difference between the support member 12 and the swing arm 13 can be further reduced, thereby reducing the thickness dimension of the folding assembly 10, and improving the stability of the support member 12 during movement due to the reduction in the height difference.

For example, refer to FIG. 14. The first support part 16 is provided on the inner side wall and the outer edge of the third recess 1303. Specifically, the first support part 16 includes a fifth part 16*a* and a sixth part 16*b* that are connected to each other. The fifth part 16*a* is provided on the inner side wall of the third recess 1303, and the sixth part 16*b* is provided on the outer edge of the third recess 1303. When the swing arm 13 is in the unfolded position, the sixth part 16*b* is in contact with the third surface 1203, and the sixth part 16*b* has the third contact surface 161. When the swing arm 13 is rotated between the unfolded position and the folded position, neither the fifth part 16*a* nor the sixth part 16*b* may be in contact with the third surface 1203, and the fifth part 16*a* may have the inclined surface 162.

Certainly, the first support part 16 is not necessarily provided on the inner wall and/or the outer edge of the third recess 1303 and may alternatively be provided at any position on the swing arm 13 outside the third recess 1303. In this case, the first support part can also support the support member 12 when the swing arm 13 is in the unfolded position.

It should be noted that, in some other embodiments, the third recess 1303 may not be provided. For example, the first support part 16 is a protruding structure protruding outward from the swing arm 13.

It should be further noted that the support member 12 is not necessarily provided with the third protruding part 124, and the third surface 1203 is not necessarily provided on the third protruding part 124. In some other embodiments, refer to FIG. 16 and FIG. 17. The support member 12 may not be provided with the third protruding part 124 on at least one side thereof, but may be provided with the third recessed part 127, and the third recessed part 127 is located on a side of the support member 12 close to the base 11. The third recessed part 127 passes through the bottom and the side of the support member 12 to allow the first support part 16 to project into. The third recessed part 127 includes the third surface 1203 on the inner bottom wall thereof. In this case, the first support part 16 corresponding to a position of the third recessed part 127 may be a protruding structure protruding outward from the swing arm 13 and may be a protruding structure in a regular shape or an irregular shape, such as a rod-shaped structure, a columnar structure, a strip-shaped structure, or a hook-like structure, but is not limited thereto.

Optionally, refer to FIG. 18. When the support member 12 includes the third recessed part 127 on each of the two opposite sides thereof, two third recessed parts 127 on the two sides may be communicated with each other. In this case, the two third recessed parts 127 may be collectively regarded as a through-recess with both ends communicated with the outside.

Optionally, the first support part 16 and the swing arm 13 are of an integrated structure, to improve the structure reliability of the first support part 16. In addition, when the third recess 1303 is provided on the swing arm 13, the inner wall and/or the outer edge of the third recess 1303 is directly formed into the first support part 16 that is a planar structure or a bulge structure, thereby facilitating production and manufacturing. Certainly, in some other embodiments, the first support part 16 and the swing arm 13 may alternatively be formed separately and connected to each other.

The foregoing embodiment describes the solution of providing the first support part 16 supporting the support member 12 on the swing arm 13, to improve the stability or smoothness of the support member 12 when the swing arm 13 is in the unfolded position. However, the implementation of improving the stability or smoothness of the support member 12 when the swing arm 13 is in the unfolded position is not limited thereto.

Optionally, in another embodiment, refer to FIG. 23. FIG. 23 is a schematic diagram of a structure of a swing arm 13 according to another embodiment of this application. The swing arm 13 is provided with a second support part 16'. The first push part 14, the second push part 15, and the second support part 16' are arranged in sequence in the direction of the rotation axis e of the swing arm 13. To be specific, the second push part 15 is located between the first push part 14 and the second support part 16'. When the swing arm 13 is in the unfolded position, the second support part 16' is located on a side of the support member 12 away from the base 11 to positionally limit the support member 12. In this case, positional limitation for the support member 12 may be provided by three parts, where two parts are located above the support member 12, and one part is located below the support member 12. In this way, a stable positional limitation structure can be formed, thereby effectively reducing a probability of the support member 12 being deflected or pried.

It may be understood that the second support part 16' may be a structure in various shapes that can positionally limit an object or block an object. For example, the second support part may be a protruding structure or a planar structure on the swing arm 13, or may be a rod-shaped structure, a block-shaped structure, a columnar structure, or a hook-like structure, but is not limited thereto. In addition, the second support part 16' may be a rigid structure or an elastic structure capable of elastic deformation.

Optionally, during rotation of the swing arm 13 between the unfolded position and the folded position (that is, when the swing arm 13 is rotated to a position between the unfolded position and the folded position), the second support part 16' may be not in contact with the support member 12, to reduce the resistance of the support member 12, thereby facilitating smoothness of the support member 12 during lifting and lowering.

Certainly, in some other embodiments, during rotation of the swing arm 13 between the unfolded position and the folded position, the second support part 16' may not be in contact with the support member 12, for example, may be configured to push the support member 12 to move toward the base 11. For example, the second support part 16' may be a structure the same as or similar to the first push part 14. Certainly, the second support part may alternatively be a structure different from the first push part 14.

Optionally, refer to FIG. 24. FIG. 24 is a schematic diagram of a structure of a support member 12 according to another embodiment of this application. Each of the two opposite sides of the support member 12 is provided with a first surface 1201, a second surface 1202, and a fourth surface 1204. Positions of the first surface 1201, the second surface 1202, and the fourth surface 1204 located on a same side of the support member 12 respectively correspond to positions of the first push part 14, the second push part 15, and the second support part 16' on the same side. When the swing arm 13 is in the unfolded position, the second support part 16' is located on a side of the fourth surface 1204 away from the base 11. For the related descriptions of the first surface 1201 and the second surface 1202, refer to the foregoing embodiment. Details are not described herein again.

Further, refer to FIG. 24 and FIG. 25. FIG. 25 is a right view of the support member 12 shown in FIG. 24. In a thickness direction h of the support member 12, height H1 of the first surface 1201 is lower than or equal to height H2 of the second surface 1202, and a height H4 of the fourth surface 1204 is lower than or equal to height H2 of the second surface 1202. It should be understood that height H1 of the first surface 1201, height H2 of the second surface 1202, and the height H4 of the fourth surface 1204 are heights based on the same reference plane s.

Based on such configuration, the technical effect of height H1 of the first surface 1201 being lower than or equal to height H2 of the second surface 1202 is already described in detail in the foregoing embodiments. Details are not described herein again. However, for height H4 of the fourth surface 1204 to be lower than or equal to height H2 of the second surface 1203 also has the same technical effect, so that the fourth surface 1203 can leave more space on the side away from the base 11 to accommodate the second support part 16', so as to further reduce the overall thickness dimensions formed by the first push part 14, the second push part 15, the second support part 16', and the support member 12, and reduce the thickness dimension of the folding assembly 10, thereby reducing the space of the folding apparatus 100 occupied in a thickness direction by the folding assembly.

Optionally, still refer to FIG. 24. The support member 12 includes a main body part 121, two first protruding parts 122, two second protruding parts 123, and two fourth protruding parts 128. The fourth protruding part 128 protrudes from each of two opposite sides of the main body part 121. The fourth protruding part 128 generally protrudes from the main body part 121 toward the swing arm 13. A protrusion direction may be generally parallel to the X-axis direction. Certainly, there may alternatively be a specific included angle between the protrusion direction and the X-axis. The fourth protruding part 128 may be a protrusion structure in various shapes, such as a block-shaped structure, a columnar structure, or a hook-like structure, but is not limited thereto. The fourth protruding part 128 includes a fourth surface 1204 on a side thereof away from the base 11. For descriptions related to the main body part 121, the first protruding part 122, and the second protruding part 123, refer to the foregoing embodiments. Details are not described herein again.

Based on such configuration, the technical effect of the first protruding part 122 and the second protruding part 123 is already described in detail in the foregoing embodiments. Details are not described herein again. The provision of the fourth protruding part 128 also has the same technical effect. Space communicated with the outside may be formed above the fourth protruding part 128 to accommodate the second support part 16', so as to prevent interference with the rotation of the second support part 16'. Furthermore, by providing the first protruding part 122, the second protruding part 123, and the fourth protruding part 128 with different heights, the first surface 1201, the second surface 1202, and the fourth surface 1204 at different heights may be formed.

Optionally, still refer to FIG. 24. In the thickness direction h of the support member 12, projection of the first protruding part 122, projection of the second protruding part 123, and projection of the fourth protruding part 128 do not overlap each other. In other words, the projection of any two of the first protruding part 122, the second protruding part 123, and the fourth protruding part 128 do not overlap each other, so that the first protruding part 122, the second protruding part 123, and the fourth protruding part 128 can be independently fitted with the first push part 14, the second push part 15, and the second support part 16' respectively, to reduce a probability of interferences with each other.

Optionally, refer to FIG. 23. The swing arm 13 is provided with a first recess 1301, a second recess 1302, and a fourth recess 1304. The first recess 1301 allows the first protruding part 122 to project into. The second recess 1302 allows the second protruding part 123 to project into. The fourth recess 1304 allows the fourth protruding part 128 to project into to avoid and accommodate the fourth protruding part 128. To be specific, during rotation of the swing arm 13 between the unfolded position and the folded position, the fourth protruding part 128 can project into the fourth recess 1304. For example, when the swing arm 13 is in the unfolded position, the fourth protruding part 128 at least partially projects into the fourth recess 1304 (that is, the fourth protruding part 128 may partially project into the fourth recess 1304, or may completely project into the fourth recess 1304). In this way, the distance between the support member 12 and the swing arm 13 can be reduced, so that a relative height difference between the support member 12 and the swing arm 13 is reduced, and the thickness of the folding assembly 10 is further reduced. In addition, an inner wall of the fourth recess 1304 may also positionally limit the fourth protruding part 128 to prevent movement of the support member 12 in the direction of the rotation axis e, thereby improving the stability of the support member 12 when moving toward or away from the base 11.

Optionally, refer to FIG. 23. The second support part 16' is provided on an inner wall and/or an outer edge of the fourth recess 1304. To be specific, the second support part 16' may be provided only on the inner wall of the fourth recess 1304, the second support part 16' may be provided only on the outer edge of the fourth recess 1304, or the second support part 16' may be provided on both the inner wall and the outer edge of the fourth recess 1304.

It may be understood that the inner wall of the fourth recess 1304 is an inner surface defining the fourth recess 1304, including an inner side wall or an inner bottom wall of the fourth recess 1304. When the bottom of the fourth recess 1304 is communicated with the shaft through hole 1305, a surface of the rotation shaft 193 located at the bottom of the fourth recess 1304 serves as the inner bottom wall of the fourth recess 1304. The outer edge of the fourth recess 1304 is a peripheral edge of a recess opening of the fourth recess 1304.

Based on such configuration, the technical effects of the first push part 14 being provided on an inner wall and/or an outer edge of the first recess 1301 and the second push part 15 being provided on an inner wall and/or an outer edge of the second recess 1302 are already described in detail in the foregoing embodiments. Details are not described herein again. Moreover, for the second support part 16' to be provided on the inner wall and/or the outer edge of the fourth recess 1303 also has the same technical effect. In this way, the second support part 16' may protrude outward away from the swing arm 13 by a shorter distance, or even does not need to protrude outward (for example, the second support part 16' is directly formed on the inner wall and/or the outer edge of the fourth recess 1303), so that a distance between the support member 12 and the swing arm 13 as well as a relative height difference between the support member 12 and the swing arm 13 can be further reduced, thereby reducing the thickness dimension of the folding assembly 10, and improving the stability of the support member 12 during movement due to the reduction in the height difference.

Certainly, the second support part 16' is not necessarily provided on the inner wall and/or the outer edge of the fourth recess 1304 and may alternatively be provided at any position on the swing arm 13 outside the fourth recess 1304. In this case, the second support part can also positionally limit the support member 12 when the swing arm 13 is in the unfolded position.

It should be noted that, in some other embodiments, the fourth recess 1304 may not be provided. For example, the second support part 16' is a protruding structure protruding outward from the swing arm 13.

It should be further noted that the support member 12 is not necessarily provided with the fourth protruding part 128, and the fourth surface 1204 is not necessarily provided on the fourth protruding part 128. In some other embodiments, refer to FIG. 26. The support member 12 may not be provided with the fourth protruding part 128 on at least one side thereof, but may be provided with the fourth recessed part 129, and the fourth recessed part 129 is located on a side of the support member 12 away from the base 11. The fourth recessed part 129 passes through the bottom and the side of the support member 12 to allow the second support part 16 to project into. The fourth recessed part 129 includes the fourth surface 1204 on the inner bottom wall thereof. In this case, the second support part 16' corresponding to a position of the fourth recessed part 129 may be a protruding structure protruding outward from the swing arm 13 and may be a protruding structure with a regular or an irregular shape, such as a rod-shaped structure, a columnar structure, a strip-shaped structure, or a hook-like structure, but is not limited thereto.

In addition, the swing arm 13 is not necessarily provided with the first push part 14, the second push part 15, the first support part 16, the second support part 16', and the like. In addition to the first push part 14 and the second push part 15 provided, one or more other push parts or support parts may be further provided. There may be one or more the first push part 14 and the second push part 15. This is not uniquely limited in embodiments of this application.

In an embodiment, refer to FIG. 7A and FIG. 9A. The swing arms 13 on the two sides of the support member 12 may be disposed symmetrically with respect to the longitudinal section m of the support member 12, thereby improving the stability of the swing arms 13 on the two sides of the support member 12 for controlling the lifting and lowering of the support member 12. Certainly, in some other embodiments, the swing arms 13 on the two sides of the support member 12 may alternatively not be disposed symmetrically.

Optionally, refer to FIG. 7A, FIG. 8, and FIG. 9A. The first push parts 14 on the two swing arms 13 on the two sides of the support member 12, the second push parts 15 on the two swing arms 13 on the two sides of the support member 12, the first support parts 16 on the two swing arms 13 on the two sides of the support member 12 may be disposed symmetrically with respect to the longitudinal section m, thereby improving the stability of the two swing arms 13 on the two sides of the support member 12, the first push parts 14, second push parts 15, and the first support parts 16 that are disposed on the swing arms for controlling the lifting and lowering of the support member 12.

Certainly, in some other embodiments, at lease one of the first push parts 14 on the two swing arms 13 on the two sides of the support member 12, the second push parts 15 on the two swing arms 13 on the two sides of the support member 12, the first support parts 16 on the two swing arms 13 on the two sides of the support member 12 may alternatively not be disposed symmetrically with respect to the longitudinal section m. For example, the first push parts 14 on the two swing arms 13 on the two sides of the support member 12 may be staggered in the direction of the rotation axis e, the second push parts 15 on the two swing arms 13 on the two sides of the support member 12 may also be staggered in the direction of the rotation axis e, and the first support part 16 on the two swing arms 13 on the two sides of the support member 12 may also be staggered in the direction of the rotation axis e.

To prevent continued rotation of the swing arm 13 when the swing arm 13 is rotated to the unfolded position, in an embodiment, as shown in FIG. 14, FIG. 27, and FIG. 28, FIG. 27 is a schematic diagram of a structure of a folding assembly 10 according to another embodiment of this application. FIG. 28 is an exploded view of the folding assembly 10 shown in FIG. 27. The swing arm 13 is provided with a first limiting part 171, and the base 11 is provided with first limiting and fitting parts 181, the first limiting part 171 is configured to abut against the first limiting and fitting part 181 when the swing arm 13 is rotated to the unfolded position so as to prevent continued rotation of the swing arm 13, thereby improving the stability of the swing arm 13 in the unfolded position, and further improving the stability of the terminal device 1000 in the unfolded state.

It may be understood that the first limiting part 171 and the first limiting and fitting part 181 may be protrusion structures in various shapes, such as protruding structures, block-shaped structures, rod-shaped structures, plate-shaped structures, or planar structures, but are not limited thereto, provided that the first limiting part 171 and the first limiting and fitting part 181 can abut against each other. The first limiting part 171 may be disposed at any position on the swing arm 13. A position of the first limiting and fitting part 181 corresponds to a position of the first limiting part 171, so that when the swing arm 13 is rotated to the unfolded position, the first limiting part 171 and the first limiting and fitting part 181 can abut against each other.

For example, refer to FIG. 14, FIG. 27, and FIG. 28. The first limiting part 171 is disposed at an end of the swing arm 13 in the direction of the rotation axis e of the swing arm, specifically, may be disposed on an end surface of the end and located on a side of the rotation shaft 193. The first limiting and fitting part 181 may be disposed on an end surface of the shaft seat 111 close to the swing arm 13. Therefore, the first limiting part 171 and the first limiting and fitting part 181 are located between the swing arm 13 and the shaft base 111 and are approximately at a same position in the direction of the rotation axis e. Both the first limiting part 171 and the first limiting and fitting part 181 may be bump structures. When the swing arm 13 is rotated from the folded position to the unfolded position, one end of the first limiting part 171 abuts against one end of the first limiting and fitting part 181.

Optionally, during rotation of the swing arm 13 from the folded position to the unfolded position, the first limiting part 171 may be in surface contact with the first limiting and fitting part 181, thereby improving the stability of positional limitation, compared with line contact and point contact. Certainly, in some other embodiments, during rotation of the swing arm 13 from the folded position to the unfolded position, the first limiting part 171 and the first limiting and fitting part 181 may alternatively be in line contact or point contact.

To prevent continued rotation of the swing arm 13 when the swing arm 13 is rotated to the folded position, in an embodiment, as shown in FIG. 14, FIG. 27, and FIG. 28, the swing arm 13 is provided with a second limiting part 172, and the base 11 is provided with a second limiting and fitting part 182. The second limiting part 172 is configured to abut against the second limiting and fitting part 182 when the swing arm 13 is rotated from the unfolded position to the folded position so as to prevent continued rotation of the swing arm 13, thereby improving the stability of the swing arm 13 in the folded position.

It may be understood that the second limiting part 172 and the second limiting and fitting part 182 may be protrusion structures of various shapes, such as protruding structures, block-shaped structures, rod-shaped structures, plate-shaped structures, or planar structures, but are not limited thereto, provided that the second limiting part 172 and the second limiting and fitting part 182 can abut against each other. The second limiting part 172 may be disposed at any position on the swing arm 13. A position of the second limiting and fitting part 182 corresponds to a position of the second limiting part 172, so that when the swing arm 13 is rotated to the folded position, the first limiting part 171 and the second limiting and fitting part 182 and abut against each other.

For example, refer to FIG. 14, FIG. 27, and FIG. 28. The second limiting part 172 is disposed at an end of the swing arm 13 in the direction of the rotation axis e of the swing arm, specifically, may be disposed on an end surface of the end and located on a side of the rotation shaft 193. The second limiting and fitting part 182 may be disposed on an end surface of the shaft seat 111 close to the swing arm 13. Therefore, the second limiting part 172 and the second limiting and fitting part 182 are located between the swing arm 13 and the shaft base 111 and are approximately at a same position in the direction of the rotation axis e. Both the second limiting part 172 and the second limiting and fitting part 182 may be bump structures. When the swing arm 13 is rotated from the unfolded position to the folded position, one end of the second limiting part 172 abuts against one end of the second limiting and fitting part 182.

Optionally, the second limiting part 172 and the first limiting part 171 may be of an integrated structure, for example, formed on a same first bump structure. The second limiting and fitting part 182 and the first limiting and fitting part 181 may be integrated structures, for example, formed on a same second bump structure. When the swing arm 13 is rotated to the unfolded position, one end of the first bump structure abuts against one end of the second bump structure. When the swing arm 13 is rotated to the folded position, the other end of the first bump structure abuts against the other end of the second bump structure.

Optionally, during rotation of the swing arm 13 from the unfolded position to the folded position, the second limiting part 172 may be in surface contact with the second limiting and fitting part 182, thereby improving the stability of positional limitation, compared with line contact and point contact. Certainly, in some other embodiments, when the swing arm 13 is during rotation of the swing arm 13 from the folded position to the unfolded position the folded position to the unfolded position, the second limiting part 172 and the second limiting and fitting part 182 may alternatively be in line contact or point contact.

To better support the foldable part 210 of the foldable screen 200, in another embodiment, as shown in FIG. 27 and FIG. 28, the folding assembly 10 further includes a panel 191. The panel 191 is disposed on the support member 12 and located on a side of the support member 12 away from the base 11, and a relative position of the panel 191 and the support member 12 is fixed. The panel 191 may be a plate-like structure in various shapes. When the terminal device 1000 is in the unfolded state, the swing arm 13 is rotated to the unfolded position, and the panel 191 may support the flat foldable part 210.

Optionally, refer to FIG. 28. The panel 191 and the support member 12 are formed separately. In other words, the panel 191 and the support member 12 are not of an integrated structure. It is convenient to process and manufacture the panel 191 and the support member 12 separately and then assemble the panel 191 and the support member 12. This not only facilitates production and processing, but also facilitates the replacement of the panel 191 and has higher flexibility.

Optionally, refer to FIG. 28. A limiting recess 1205 is provided at a side of the support member 12 away from the base 11. The panel 191 is disposed in the limiting recess 1205 to facilitate the installation and positional limitation of the panel 191.

It should be noted that, in some other embodiments, the panel 191 and the support member 12 may alternatively be of an integrated structure. In this case, the support member 12 serves as the panel 191. To be specific, the side of the support member 12 away from the base 11 may directly support the foldable part 210.

To facilitate support or protection of the base 11, in another embodiment, as shown in FIG. 27 and FIG. 28, the folding assembly 10 further includes a shaft cover 192. The base 11 is disposed on the shaft cover 192 and located between the support member 12 and the shaft cover 192. The shaft cover 192 is located on a side of the base 11 away from the support member 12. The shaft cover 192 can support the base 11 and protect the base 11 and the support member 12.

It may be understood that the base 11 may be disposed on the shaft cover 192 in various ways, such as pin and hole limiting and fitting, threaded connection (such as screw or bolt connection), or bonding, but is not limited thereto. When the folding apparatus 100 has a plurality of folding assemblies 10, the shaft covers 192 of the folding assemblies 10 may be connected to form an integrated structure, or certainly, may be disposed separately.

Optionally, still refer to FIG. 27 and FIG. 28. The swing arm 13 is provided with a cut-out recess 1306. When the swing arm 13 is in the unfolded position, the cut-out recess 1306 is located on a side of the swing arm 13 close to the shaft cover 192, and a side edge 1921 of the shaft cover 192 projects into the cut-out recess 1306. The provision of the cut-out recess 1306 may avoid the side edge 1921 of the shaft cover 192, to facilitate smooth rotation of the swing arm 13 to the unfolded position without interfering with the shaft cover 192. In addition, because the side edge 1921 of the shaft cover 192 projects into the cut-out recess 1306, compared with a case in which the cut-out recess 1306 is not provided, a thickness of a part of the swing arm 13 may be the same as a thickness of a part of the shaft cover 192, thereby reducing an overall thickness of the swing arm 13 and the shaft cover 192 and further reducing the thickness dimension of the folding assembly 10.

It should be noted that, in some other embodiments, the shaft cover 192 may alternatively not be provided separately, and the base 11 serves as the shaft cover 192. In this case, it may also be understood that the shaft cover 192 and the base 11 are of integrated structures.

The foregoing is merely a specific implementation of this application, but is not intended to limit the protection scope of this application. Any variation or replacement readily figured out by a person skilled in the art within the technical scope disclosed in this application shall fall within the protection scope of this application.

The invention claimed is:

1. A folding assembly, the folding assembly comprising:

a base;

a support member; and at least two swing arms, respectively arranged at two width sides of the support member, wherein the swing arms are rotatably connected to the base to enable each swing arm to be rotatable between an unfolded position and a folded position, wherein each swing arm is provided with a first push part and a second push part, and the first push part and the second push part are arranged in sequence in a length direction of a rotation axis of the swing arm; the support member comprises first surfaces and second surfaces at each of two opposite height sides of the support member, each first surface is arranged corresponding to the first push part, and each second surface is arranged corresponding to the second push part; and during rotation of the swing arm from the unfolded position to the folded position, the first push part abuts against the first surface to push the support member to move toward the base, and during rotation of the swing arm from the folded position to the unfolded position, the second push part abuts against the second surface to push the support member to move away from the base.

2. The folding assembly according to claim 1, wherein the first surface is configured to contact and be fitted with the first push part on a same side, and the second surface is configured to contact and be fitted with the second push part on a same side; and when the swing arm is in a position between the unfolded position and the folded position, the first push part is located on a side of the first surface away from the base, and the second push part is located on a side of the second surface close to the base.

3. The folding assembly according to claim 2, wherein in a thickness direction of the support member, a height of the first surface is lower than or equal to a height of the second surface; and the thickness direction of the support member is parallel to a direction in which the support member moves toward or away from the base.

4. The folding assembly according to claim 3, wherein the support member comprises:

a main body part;

first protruding parts, wherein each of two sides of the main body part is provided with the first protruding part; and second protruding parts, wherein each of the two sides of the main body part is provided with the second protruding part; and the first protruding part comprises the first surface on a side thereof away from the base, and the second protruding part comprises the second surface on a side thereof close to the base.

5. The folding assembly according to claim 4, wherein the swing arm is provided with a first recess and a second recess; when the swing arm is in the unfolded position, the first protruding part at least partially projects into the first recess;

and when the swing arm is in the folded position, the second protruding part at least partially projects into the second recess; and the first push part is provided on an inner wall and/or an outer edge of the first recess, and the second push part is provided on an inner wall and/or an outer edge of the second recess.

6. The folding assembly according to claim 4, wherein relief spaces are provided in the base, and positions of the relief spaces correspond to positions of the first protruding parts;

and when the swing arm is in the folded position, the first protruding part is at least partially located in the relief space.

7. The folding assembly according to claim 6, wherein the relief space is provided at each of two sides of the base, the base has a connection part formed between the two relief spaces, a relief recess is provided at a side of the main body part close to the base, and when the swing arm is in the folded position, the connection part is at least partially located in the relief recess.

8. The folding assembly according to claim 1, wherein the first push part has a first cam surface; and during rotation of the swing arm from the unfolded position to the folded position, the first cam surface forms a cam-follower mate with the first surface.

9. The folding assembly according to claim 1, wherein the second push part has a second cam surface; and during rotation of the swing arm between the unfolded position and the folded position, the second cam surface forms a cam-follower mate with the second surface.

10. The folding assembly according to claim 1, wherein when the swing arm is in the folded position, the first push part is in contact with the first surface, and a gap exists between the second push part and the second surface.

11. The folding assembly according to claim 10, wherein the first push part has a first contact surface; and when the swing arm is in the folded position, the first contact surface is in surface contact with the first surface.

12. The folding assembly according to claim 1, wherein the support member is supported on the base when the swing arm is in the folded position.

13. The folding assembly according to claim 1, wherein when the swing arm is in the unfolded position, the second push part is in contact with the second surface, and a gap exists between the first push part and the first surface.

14. The folding assembly according to claim 13, wherein the second push part has a second contact surface; and when the swing arm is in the unfolded position, the second contact surface is in surface contact with the second surface.

15. The folding assembly according to claim 1, wherein the swing arm is provided with a first support part, the first support part, the first push part, and the second push part are arranged in sequence in the direction of the rotation axis of the swing arm; and when the swing arm is in the unfolded position, the first support part is located on a side of the support member close to the base to support the support member.

16. The folding assembly according to claim 15, wherein the first support part has a third contact surface; and when the swing arm is in the unfolded position, the third contact surface is in surface contact with the support member.

17. The folding assembly according to claim 15, wherein the first support part is not in contact with the support member when the swing arm is in a position between the unfolded position and the folded position.

18. The folding assembly according to claim 17, wherein the first support part has an inclined surface, the inclined surface is located on a side of a part of the first support part supporting the support member; and when the swing arm is in the unfolded position, the inclined surface is not in contact with the support member and is inclined toward the base from the support member.

19. A folding apparatus, the folding apparatus comprising:

a first housing; a second housing; and a folding assembly; wherein the folding assembly comprises a base, a support member and at least two swing arms;

the two swing arms are respectively arranged at two width sides of the support member, wherein the swing arms are rotatably connected to the base to enable each swing arm to be rotatable between an unfolded position and a folded position;

each swing arm is provided with a first push part and a second push part, and the first push part and the second push part are arranged in sequence in a length direction of a rotation axis of the swing arm; the support member comprises first surfaces and second surfaces at each of two opposite height sides of the support member, each first surface is arranged corresponding to the first push part, and each second surface is arranged corresponding to the second push part;

during rotation of the swing arm from the unfolded position to the folded position, the first push part abuts against the first surface to push the support member to move toward the base, and during rotation of the swing arm from the folded position to the unfolded position, the second push part abuts against the second surface to push the support member to move away from the base; and the first housing is connected to the swing arm on one side of the support member, and the second housing is connected to the swing arm on the other side of the support member.

20. A terminal device, the terminal device comprising:

a folding apparatus; and a foldable screen;

wherein the folding apparatus comprises a first housing, a second housing, and a folding assembly;

the folding assembly comprises a base, a support member, and at least two swing arms;

the two swing arms are respectively arranged at two width sides of the support member, wherein the swing arms are rotatably connected to the base to enable each swing arm to be rotatable between an unfolded position and a folded position;

each swing arm is provided with a first push part and a second push part, and the first push part and the second push part are arranged in sequence in a direction of a rotation axis of the swing arm; the support member comprises first surfaces and second surfaces at each of two opposite height sides of the support member, each first surface is arranged corresponding to the first push part, and each second surface is arranged corresponding to the second push part;

during rotation of the swing arm from the unfolded position to the folded position, the first push part abuts against the first surface to push the support member to move toward the base, and during rotation of the swing arm from the folded position to the unfolded position, the second push part abuts against the second surface to push the support member to move away from the base;

the first housing is connected to the swing arm on one side of the support member, and the second housing is connected to the swing arm on the other side of the support member; and the foldable screen is disposed on the first housing and the second housing, wherein a position of a foldable part of the foldable screen corresponds to a position of the support member of the folding assembly.

* * * * *